(12) United States Patent
Chien et al.

(10) Patent No.: US 10,880,981 B2
(45) Date of Patent: Dec. 29, 2020

(54) COLLECTOR PELLICLE

(71) Applicant: TAIWAN SEMICONDUCTOR MANUFACTURING CO., LTD., Hsinchu (TW)

(72) Inventors: Shang-Chieh Chien, New Taipei (TW); Chi Yang, Hsinchu (TW); Jen-Yang Chung, Penghu County (TW); Shao-Wei Luo, Hsinchu (TW); Tzung-Chi Fu, Miaoli (TW); Chun-Kuang Chen, Hsinchu County (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/132,990

(22) Filed: Sep. 17, 2018

(65) Prior Publication Data

US 2019/0104604 A1 Apr. 4, 2019

Related U.S. Application Data

(60) Provisional application No. 62/566,106, filed on Sep. 29, 2017.

(51) Int. Cl.
*H05G 2/00* (2006.01)
*G03F 7/20* (2006.01)
*G21K 1/06* (2006.01)

(52) U.S. Cl.
CPC ......... *H05G 2/006* (2013.01); *G03F 7/70033* (2013.01); *G03F 7/70175* (2013.01); *G03F 7/70316* (2013.01); *G03F 7/70958* (2013.01); *G03F 7/70983* (2013.01); *G21K 1/062* (2013.01); *H05G 2/008* (2013.01)

(58) Field of Classification Search
None
See application file for complete search history.

(56) References Cited

U.S. PATENT DOCUMENTS

| | | | | |
|---|---|---|---|---|
| 4,219,233 A * | 8/1980 | Rodgers | ................ | A47C 7/443 297/300.4 |
| 7,915,600 B2 * | 3/2011 | Ueno | ................ | B82Y 10/00 250/504 R |
| 8,129,700 B2 * | 3/2012 | Ueno | ................ | H05G 2/008 250/504 R |
| 8,450,706 B2 * | 5/2013 | Abe | ................ | G03F 7/70941 250/496.1 |
| 2004/0067424 A1 * | 4/2004 | Schilz | ................ | G03F 1/64 430/5 |

(Continued)

FOREIGN PATENT DOCUMENTS

| JP | 5001055 B | * | 1/1993 |
|---|---|---|---|
| JP | 5001055 Y2 | * | 1/1993 |
| JP | 5001055 B2 | * | 8/2012 |

*Primary Examiner* — Andrew Smyth
(74) *Attorney, Agent, or Firm* — McDermott Will & Emery LLP

(57) ABSTRACT

An extreme ultraviolet (EUV) source includes a collector mirror, a drain, a droplet generator configured to eject a target material toward the drain, a pellicle disposed over the collector mirror. The pellicle is configured to catch debris formed of the target material.

20 Claims, 16 Drawing Sheets

(56) References Cited

U.S. PATENT DOCUMENTS

| | | | |
|---|---|---|---|
| 2006/0249698 A1* | 11/2006 | Endo | H05G 2/003 250/504 R |
| 2008/0087840 A1* | 4/2008 | Ueno | H05G 2/001 250/396 ML |
| 2008/0267816 A1* | 10/2008 | Ueno | B08B 17/02 422/24 |
| 2009/0261277 A1* | 10/2009 | Soumagne | G03F 7/70033 250/504 R |
| 2009/0272919 A1* | 11/2009 | Abe | G03F 7/70808 250/504 R |
| 2010/0258748 A1* | 10/2010 | Vaschenko | G21K 5/00 250/504 R |
| 2015/0160569 A1* | 6/2015 | Osorio Oliveros | G21K 1/062 430/5 |
| 2015/0253674 A1* | 9/2015 | Nagai | G03F 7/70458 438/795 |
| 2015/0293460 A1* | 10/2015 | Takehisa | G03F 1/84 355/67 |
| 2016/0128171 A1* | 5/2016 | Kuritsyn | G03F 7/70033 250/504 R |
| 2016/0227638 A1* | 8/2016 | Hori | H05G 2/008 |
| 2017/0068157 A1* | 3/2017 | Park | G03F 1/24 |
| 2017/0075212 A1* | 3/2017 | Goldfarb | B08B 3/08 |
| 2017/0205704 A1* | 7/2017 | Nikipelov | G03F 7/70575 |
| 2018/0314150 A1* | 11/2018 | Brouns | G03F 1/62 |

* cited by examiner

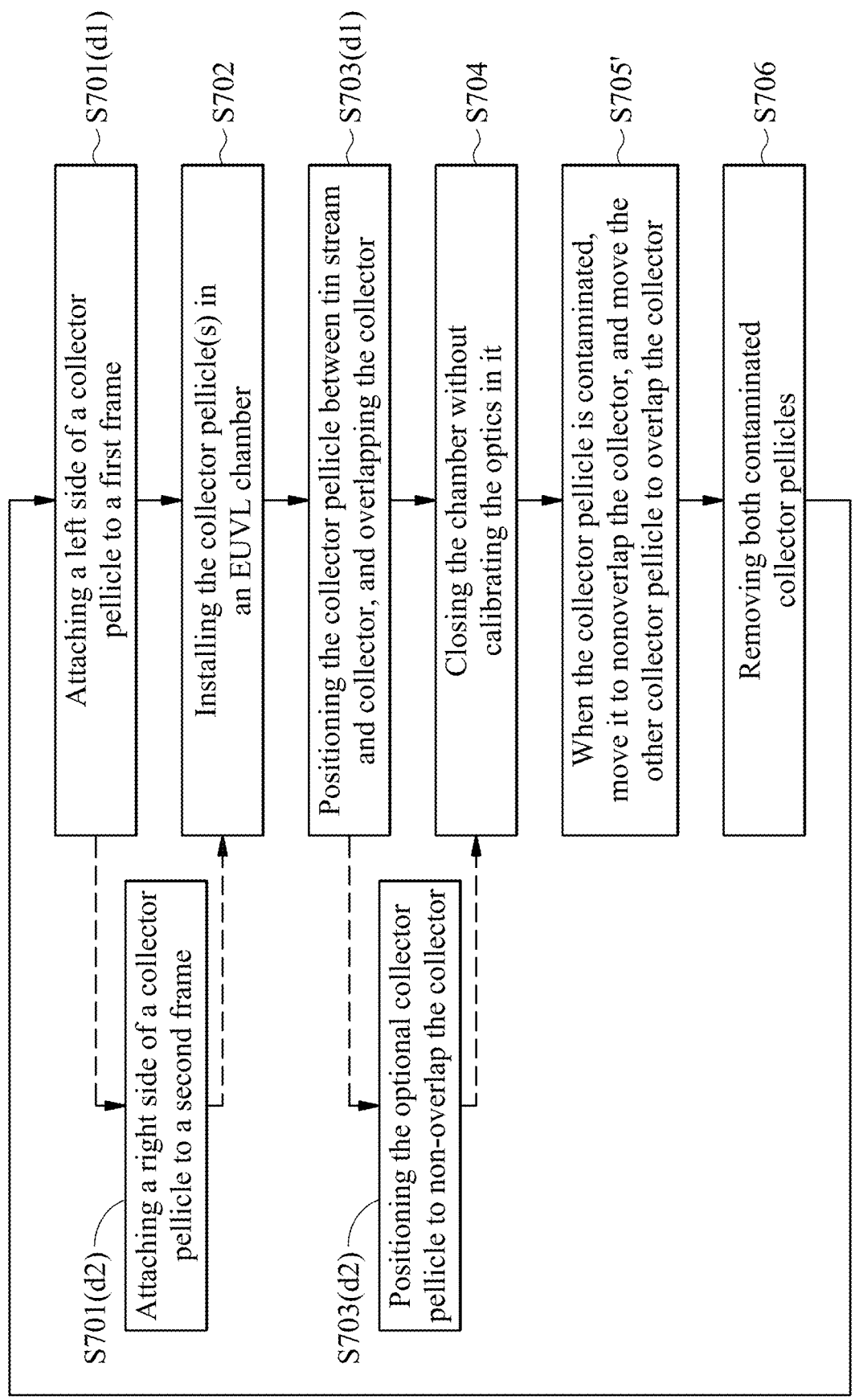

COLLECTOR PELLICLE

CROSS-REFERENCE TO RELATED APPLICATION

The present application claims priority to and incorporates by reference in its entirety U.S. Provisional Application 62/566,106 filed on Sep. 29, 2017.

TECHNICAL FIELD

The present disclosure is related to extreme ultraviolet lithography (EUVL) systems having an EUV light source.

BACKGROUND

As device size shrinks, it is necessary to create finer patterns. Extreme ultraviolet (EUV) photolithography can form finer patterns than ultraviolet photolithography. EUV photolithography relies on plasma formation to emit the EUV light rays. In EUV photolithography, the laser beam hits a first target (i.e. a metal droplet stream) to form plasma which emits EUV light rays which in turn are reflected off a collector mirror and directed toward a second target—the photosensitive coating coated substrate. Since the EUV light rays generated from the plasma travels in all directions, the EUV light rays travelling in a direction opposite to the path toward the target substrate would be wasted if not collected and re-directed towards the intended target. A high quality collector mirror is thus required to collect and re-direct the EUV light rays toward the target substrate and focus the collected light rays to an intermediate focus (IF) for reflecting off a patterned mask or reticle onto a target substrate.

The collector (mirror) reflectance is an important factor in an EUV light source for an EUV lithography (EUVL) system. The reflective quality of the collector directly affects the power and wavelength of the reflected EUV light rays. A low quality collector mirror having uneven thickness, uneven surface roughness, and non-uniform reflectance of layers in the mirror, reduces the total amount of reflected EUV light rays and the reflected EUV light rays have a lower power and different or a mixture of wavelengths, compared with the EUV light rays directly generated from the plasma. The collector mirror is subject to contamination. For example, plasma formation during the EUV light ray generation also generates debris which may deposit on the reflective surface of the collector mirror, thereby contaminating the reflective surface of the collector mirror and lowering the quality of the reflected EUV light rays. Thus, EUV collectors have a limited service life, as they tend to be fouled by accumulating tin debris, which degrades the reflectance of the collector when in use. Thus, the EUV collector mirror needs to be replaced after a certain period of use due to the debris contamination. Each time a fouled/contaminated collector is replaced, several days of production are lost for the EUVL system, because the optics between the collector, source, and scanner have to re-aligned.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7(d) shows a method of operating the collector pellicle, according to another embodiment of the present disclosure.

DETAILED DESCRIPTION

Figure 1:
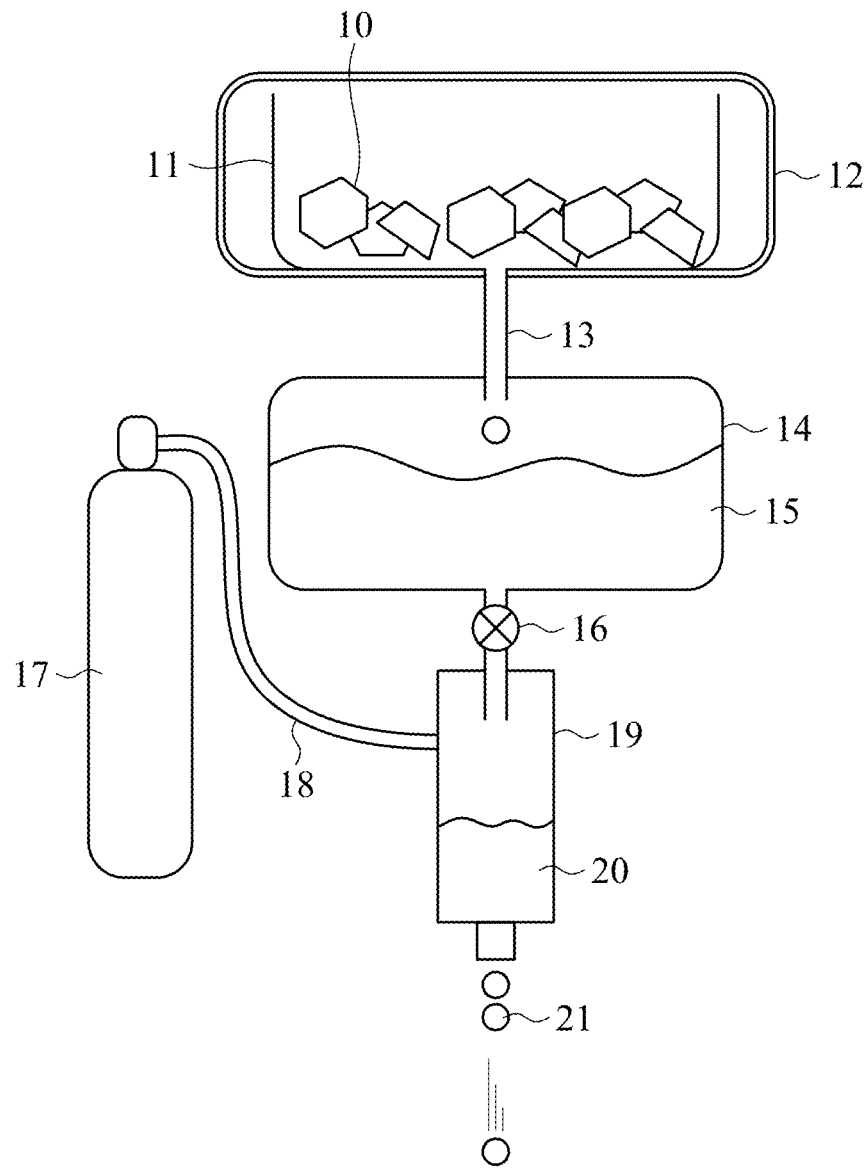
FIG. 1 shows an apparatus for forming liquid metal droplets in an EUVL laser system, according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

With the increasing trend of the Moore's law for decreasing the size of chip components and the demand of higher computing power chips for mobile electronic devices such as smart phones with computer functions. The search for a light source to achieve the size-shrinking demand of chip patterns has resulted in an extreme ultraviolet EUV photolithography technique that uses an EUV radiation source to emit a EUV light with a wavelength of 13.5 nm. Because this wavelength borders the x-ray radiation wavelength region, the EUV radiation source is also called a soft x-ray radiation source. The EUV light generated from plasma formation due to pulsed laser-metal interaction has a pulse duration of about 100 ns and the EUV energy fluence per pulse can be in a range from 100 W to 1 kW at the intermediate focus.

The EUV light rays are produced from a source such as laser-produced plasma source, discharge plasma source, or synchrotron radiation. In embodiments of the present disclosure, the laser-produced plasma source is presented. The laser-produced plasma is formed by interaction between laser and a liquid metal. The metal includes tin (Sn) and lithium (Li), in some embodiments of the present disclosure.

FIG. 1 shows an apparatus or a target delivery system to form liquid metal droplets for the interaction between laser and the droplets to form a laser-produced plasma source for emission of EUV rays. As shown in FIG. 1, the apparatus includes a container 11 containing solid tin 10. The container 11 is made of a suitable heat-conductive material that does not react with the tin 10, in some embodiments of the present disclosure. The container 11 is enclosed in an enclosure 12 for maintaining a desired atmosphere with a specific gas pressure inside, in some embodiments of the present disclosure. In other embodiments of the present disclosure, the enclosure 12 maintains a desired level of vacuum inside the container 11. Also, the enclosure 12 includes a heater (not shown) to provide thermal energy to the tin 10 for phase transition to the liquid phase. The heater can be any heater, such as a resistive coil heater, gas heater, radiant heater, or magnetic heater, in some embodiments of the present disclosure. The phase-transformed (liquid) tin 10 passes through a delivery tube 13 to a container 14 that collects the liquid tin 10. A valve 16 is included in the target delivery system to control the amount of the liquid tin 10 delivered from the delivery tube 13 to enter the injection system 19. The valve 16 can be any valve such as a solenoid valve, robotic valve, or even manual valve with high precision control, in some embodiments of the present disclosure. The valve 16 is connected to a controller to control the valve 16 during the EUV generation process, in some embodiments of the present disclosure. The injection system 19 is connected with a gas cylinder 17 through a gas tube 18. The gas cylinder 17 stores an inert gas, such as He or nitrogen $N_2$, in some embodiments of the present disclosure. The gas entering the injection system 19 is pressurized to eject the liquid tin 20 to form an ejected tin droplet 21 in a droplet shape for forming plasma by laser-metal interaction in some embodiments of the present disclosure. The tin droplet 19 also includes solid particles inside the liquid droplet. The frequency of ejection of the tin droplets 21 is controlled by the controller controlling the injection system 19 or by another controller so as to synchronize with the laser pulse generated by a pulsed laser source, in some embodiments of the present disclosure. The speed of the ejected tin droplet 21 can be about 2 $ms^{-1}$ in some embodiments of the present disclosure.

Figure 2:
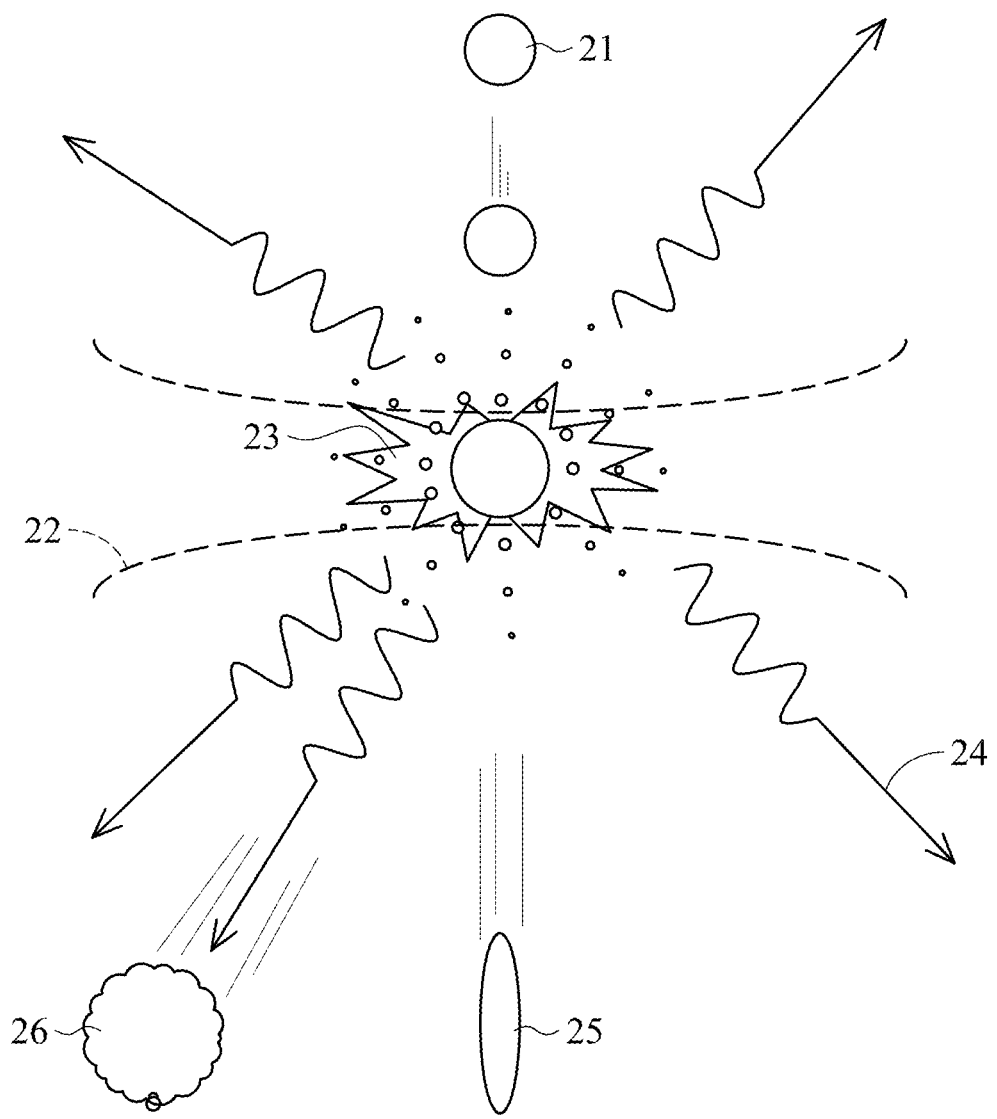
FIG. 2 shows a schematic view of plasma formation process through laser-metal interaction between a laser beam and a metal droplet.

FIG. 2 shows a schematic view demonstrating the plasma formation process through laser-metal interaction between a high-power and high-pulse-repetition-rate laser beam and a metal droplet. In FIG. 2, the ejected tin droplet 21 passes to a desired spot (also called 'ignition site', 'initiation site', or 'sight of fireball') where it interacts with the laser to form plasma. The ignition site is at a focus of the high-power and high-pulse-repetition-rate pulsed laser beam 22. The laser beam 22 may be generated by a gas laser including an excimer gas discharge laser, $CO_2$ laser, helium-neon laser, nitrogen laser, transversely excited atmospheric (TEA) laser, argon ion laser, copper vapor laser, KrF laser or ArF laser; or a solid state laser including Nd:YAG laser, Nd:glass laser, ytterbium-doped glasses or ceramics laser, or ruby laser. The laser beam 22 interacts with the ejected tin droplet 21 at the ignition site in a space of the chamber of the EUVL system to form plasma 23 which emits EUV light rays 24 in all directions. During this laser-metal interaction, a tin droplet 21 could be missed by or not interact sufficiently with the laser beam 22, thereby passing to a position below the ignition site in FIG. 2, forming debris tin droplet 25. Also, some tin leftover from the plasma formation process can become debris 26. The debris droplet 25 and debris 26 can accumulate on the surface of the EUV collector mirror, deteriorating the reflective quality of the EUV collector mirror. Debris and droplet contaminated collector mirrors need to be more frequently cleaned and/or replaced, thereby increasing the maintenance cost, and more importantly, reducing the availability of the EUVL system. Replacement of the EUV collector mirror may require up to 4 days. Therefore, there is a demand for an improved method of cleaning the EUV collector contaminated by the debris droplet 25 and the debris 26.

Figure 3A:
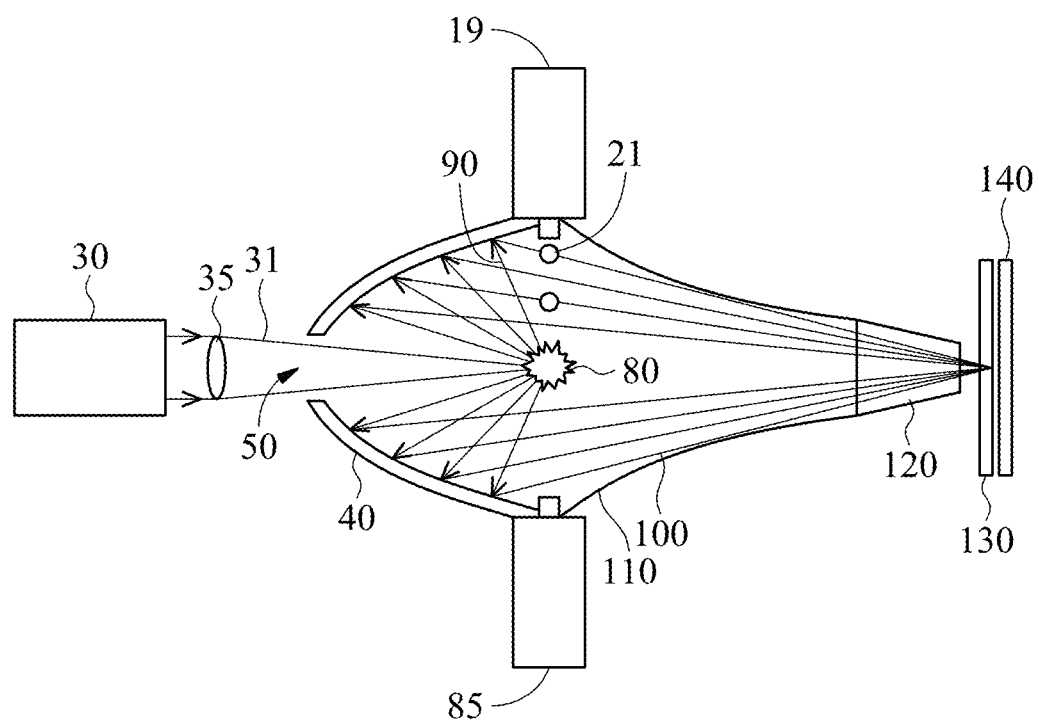
FIG. 3(a) shows a cross-sectional view of a transmissive EUVL system having an EUV light source in an ideal operation situation.

FIG. 3(a) shows a cross-sectional view of a transmissive EUVL system having an EUV light source in an ideal operation situation. The EUVL system includes a laser generating system 30, a laser-focusing lens 35, an EUV collector mirror 40, a target delivery system or tin droplet ejection system 19, a drain for unreacted tin droplet 85, a vane portion 110, a cone portion 120, a patterned mask or reticle 130, and a target substrate 140. The EUV collector mirror 40 is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc with a capping layer including SiO$_2$, Ru, TiO$_2$, and ZrO$_2$, in some embodiments of the present disclosure. The diameter of the EUV collector mirror 40 can be about 330 mm to about 750 mm, etc. depending on the chamber size of the EUVL system. The cross-sectional shape of the collector mirror 40 can be elliptical or parabolic, in some embodiments of the present disclosure. In some embodiments, a capping layer (not shown) is formed on the collector mirror 40. The capping layer includes SiO$_2$, Ru, TiO$_2$, and ZrO$_2$, in some embodiments of the present disclosure.

The target delivery system or tin droplet ejection system 19 ejects tin droplet toward the drain system 85, forming a target stream of tin droplets. In the ideal operation situation of the EUVL system, a high-power and high-pulse-repetition-rate laser beam is emitted from a laser source 30 such as a gas discharge laser or a solid state laser. The emitted laser beam is focused through a focusing lens 35 forming a focused laser beam 31 which passes through an aperture 50 formed in an EUV collector mirror 40. The focused laser beam 31 is focused at an ignition site to form plasma 80 through laser-metal interaction between the laser beam 31 and the metal droplet 21 ejected from the ejection system 19. EUV light rays 90 are formed and emitted from the plasma 80 in all directions. The emitted EUV light rays 90 directed toward the EUV collector mirror 40 are reflected as reflected EUV light rays 100 and pass through the region 110 (vane portion/region) and the region 120 (cone portion/region) to another focus (called 'intermediate focus') at which a patterned transmissive mask or reticle 130 is located. The transmissive mask 130 including a pattern having openings is located for the reflected laser beam to pass through the openings and reach the photo-sensitive coating on a target substrate 140, facilitating the transmissive EUV photolithography processing of the semiconductor substrate for forming electronic device components or circuits on the semiconductor substrate. Reflective EUV photolithography (FIG. 3(d)) is an alternative to transmissive EUV photolithography. In reflective EUV photolithography (FIG. 3(d)), a reflective patterned mask 130 or reticle with reflective patterns is located at the second focus or intermediate focus to reflect the EUV light rays 100 off the reflective mask 130 in a patternwise manner toward the target substrate 140 or through a series of optical components (not shown) to reach the target substrate 140. In the transmissive and reflective embodiments shown in FIGS. 3(a) and 3(d), the plasma formation is 'clean' as no debris is formed and the EUV collector mirror 40 is not contaminated and no replacement of the EUV collector mirror 40 due to tin debris is needed.

Figure 3B:
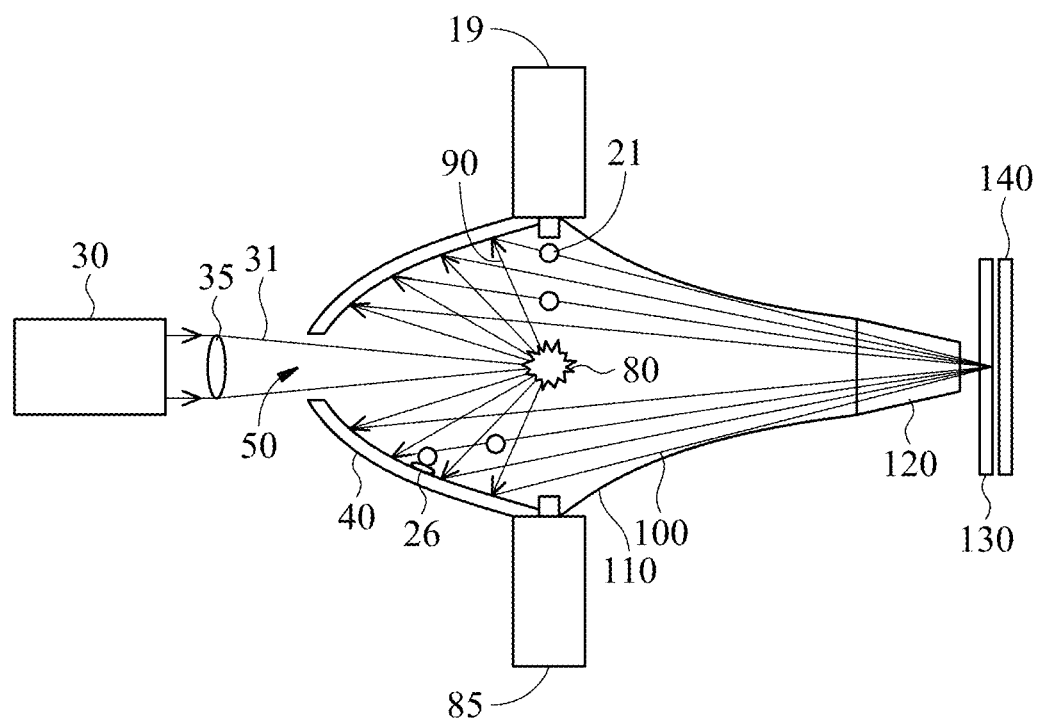
FIG. 3(b) shows a cross-sectional view of a transmissive EUVL system having an EUV light source in an operation situation.

FIG. 3(b) shows a cross-sectional view of a transmissive EUVL system having an EUV light source. The EUVL system includes a laser generating system 30, a laser-focusing lens 35, an EUV collector mirror 40, a target delivery system or tin droplet ejection system 19, a drain of the unreacted tin droplet 85, a vane portion 110, a cone portion 120, a patterned mask or reticle 130, and a target substrate 140. The EUV collector mirror 40 is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc with a capping layer including SiO$_2$, Ru, TiO$_2$, and ZrO$_2$, in some embodiments of the present disclosure. The diameter of the EUV collector mirror 40 can be about 330 mm to about 750 mm depending on the chamber size of the EUVL system. The cross-sectional shape of the collector mirror 40 can be elliptical or parabolic, in some embodiments of the present disclosure.

Since plasma 80 includes active and highly charged particles or ions such as Sn ions, and a spatial positional error/tolerance may exist between the tin droplet 21 and the focus position of the laser beam 31, debris is formed and can be pushed by the high power radiation toward the lower-half region of the reflective surface of the EUV collector mirror 40, causing contamination of the EUV collector mirror 40. Also, due to the synchronization control the laser beam pulse frequency and the speed of the ejected tin droplet 21, debris 25 of laser-missed or under-reacted portions of the tin droplet can be formed which deposits on the lower-half portion of the reflective surface of the EUV collector mirror 40. The deposited debris or droplet deteriorates the reflective property of the EUV collector mirror 40, thereby lowering the power of EUV light for EUV photolithography of the target substrate 140, and lowering the quality (such as critical dimension CD and line edge roughness LER) of patterns formed on the photo-sensitive coating (not shown) on the target semiconductor substrate 140. Therefore, there is a demand for preventing the debris and droplet deposition onto the reflective surface of the EUV collector mirror 40.

Cleaning methods to clean the reflective surface of the EUV collector mirror 40 includes passing hydrogen gas through the aperture 50 of the collector mirror 40 into the chamber to generate hydrogen free radicals to remove the deposited tin debris coatings, in some embodiments of the present disclosure. Even if a new EUV collector mirror to replace the contaminated EUV collector mirror 40 is not needed, the cleaning process is time consuming and a perfectly restored surface is not guaranteed. Therefore, methods, other than cleaning the EUV collector mirror, that can shorten the time for replacement or cleaning of the debris and droplet contaminated EUV collector mirror 40 in FIG. 3(b) are needed.

Figure 3C:
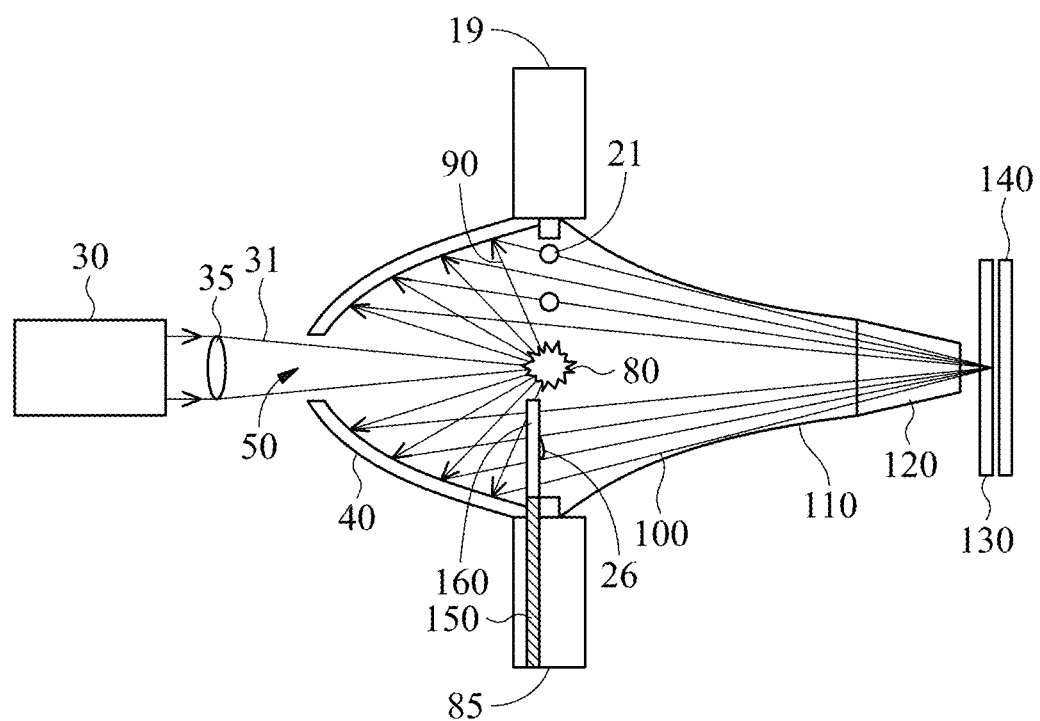
FIG. 3(c) shows a cross-sectional view of a transmissive EUVL system having an EUV light source in an operation situation according to an embodiment of the present disclosure.
Figure 3D:
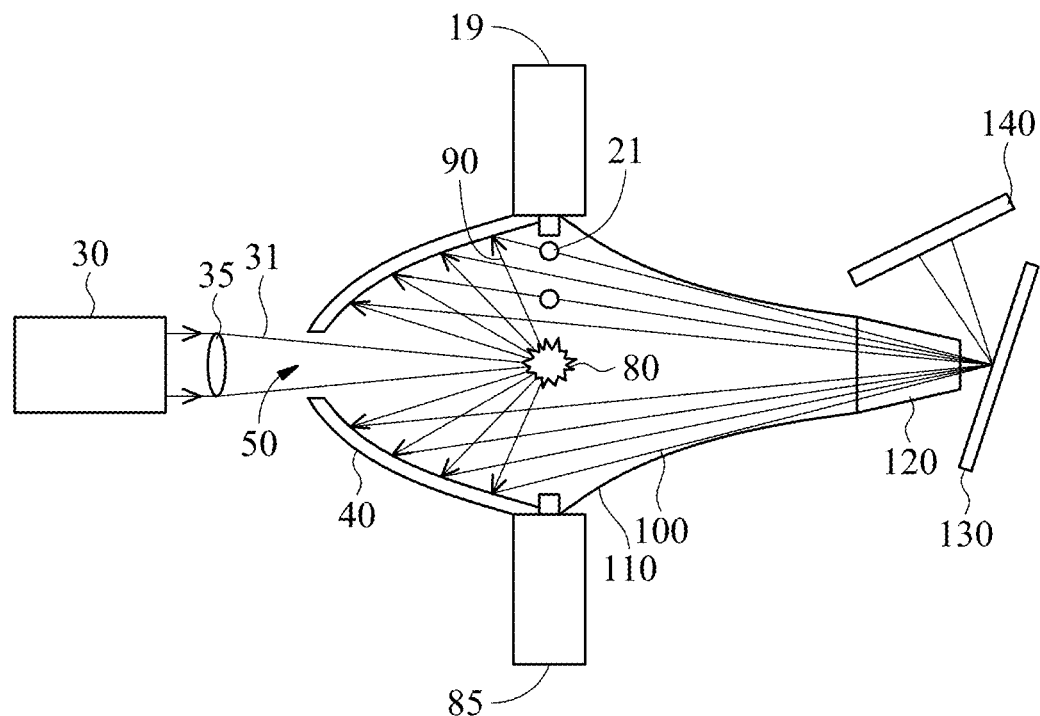
FIG. 3(d) shows a cross-sectional view of a reflective EUVL system having an EUV light source in an ideal operation situation.
Figure 3E:
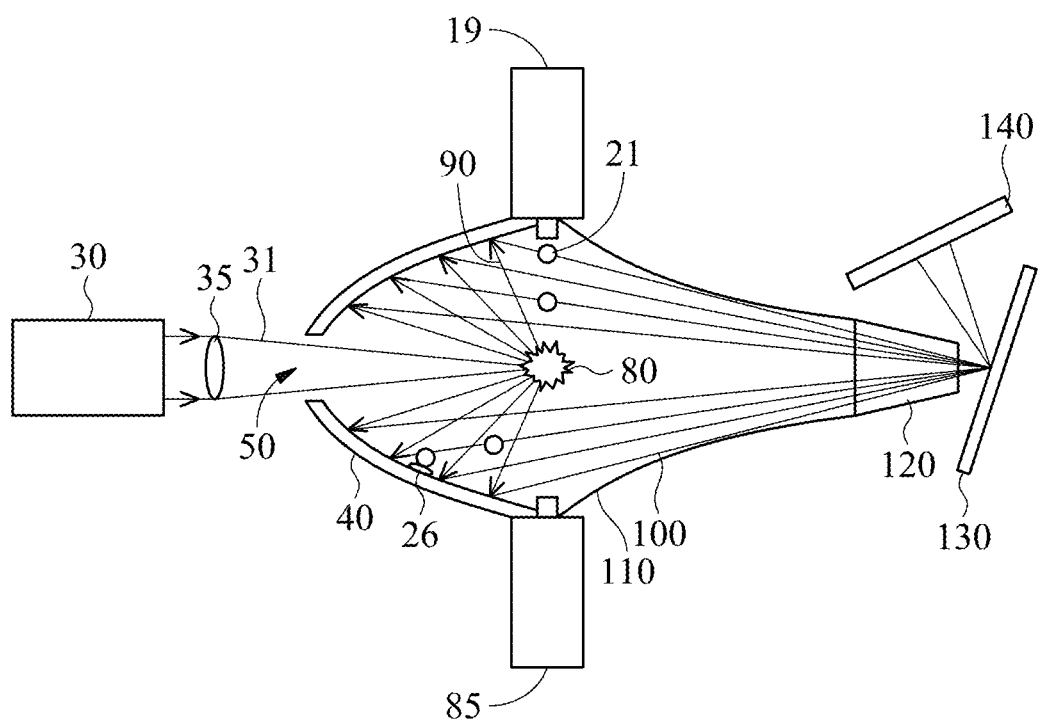
FIG. 3(e) shows a cross-sectional view of a reflective EUVL system having an EUV light source in an operation situation.

In reflective EUV photolithography (FIG. 3(e)), a reflective patterned mask 130 or reticle with reflective patterns is located at the second focus or intermediate focus to reflect the EUV light rays 100 off the reflective mask 130 in a patternwise manner toward the target substrate 140 or through a series of optical components (not shown) to reach the target substrate 140. The debris 26 is deposited on the reflective surface of the collector mirror 40, causing degradation of reflective properties.

Figure 4:
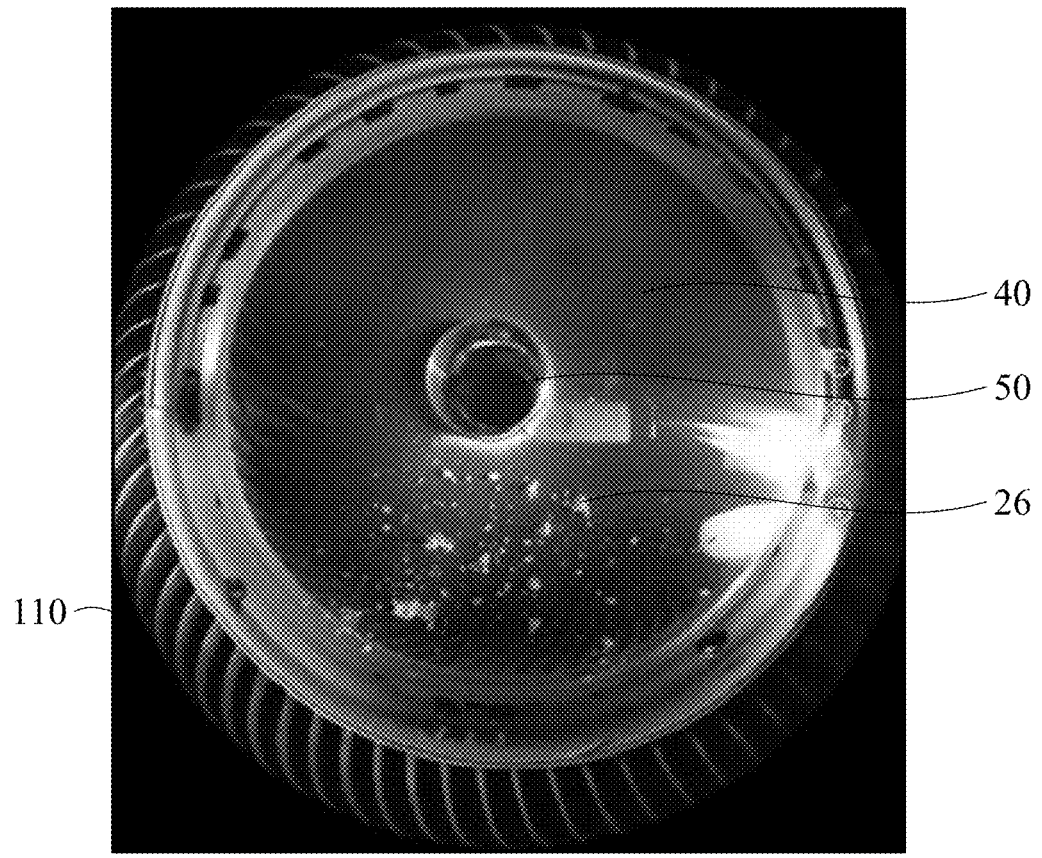
FIG. 4 shows contamination of the EUV collector mirror in the chamber of the EUVL system.

FIG. 4 shows collector contamination of the EUV collector mirror 40 having the aperture 50 located before the vane portion 110 in FIG. 3(b). After prolonged use, the area of the reflective surface of the collector mirror 40 covered by the deposited debris 26 increases and the functioning of the collector mirror 40 decreases. Without replacement of the debris 26 contaminated collector mirror 40, the quality of the pattern formed on the target substrate 140 using this contaminated collector mirror 40 would be degraded, affecting the productivity of high quality chips. Replacement of the collector mirror 40 takes several days and the tuning of parameters after the replacement takes additional time. Thus, replacement of the collector mirror 40 is not desired. A solution to solve the problem of debris contamination of the lower half region of the reflective surface of the collector mirror 40 is desired.

FIG. 3(c) shows a cross-sectional view of an EUVL system having an EUV light source according to an embodiment of the present disclosure. The EUVL system includes a laser generating system 30, a laser-focusing lens 35, an EUV collector mirror 40, a target delivery system or tin droplet ejection system 19, a drain for the unreacted tin droplet 85, a vane portion 110, a cone portion 120, a patterned mask or reticle 130, a target substrate 140, and a collector pellicle 160 installed with frame 150.

The EUV collector mirror 40 is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc with a capping layer including SiO$_2$, Ru, TiO$_2$, and ZrO$_2$, in some embodiments of the present disclosure. The diameter of the EUV collector mirror 40 can range from about 330 mm to about 750 mm depending on the chamber size of the EUVL system. The cross-sectional shape of the collector mirror 40 can be elliptical or parabolic, in some embodiments of the present disclosure.

The collector pellicle 160 is made of a EUV light-transmitting material including silicon carbide, polysilicon, graphene, or silicon nitride, in some embodiments of the present disclosure. The thickness of the collector pellicle 160 is not limited as long as the EUV light rays can pass through without optical absorption or intensity reduction. The surface roughness of the collector pellicle 160 is less than about 5 nm.

During operation of the EUVL system, the target delivery system or tin droplet ejection system 19 ejects tin droplets toward the drain system 85, forming a target stream of tin droplets. A high-power and high-pulse-repetition-rate laser beam is emitted from a laser source 30, such as a gas discharge laser or a solid state laser. The emitted laser beam is focused through a focusing lens 35 forming a focused laser beam 31 which passes through an aperture 50 formed in an EUV collector mirror 40. The focused laser beam 31 is then focused at an ignition site to form plasma 80 through laser-metal interaction between the laser beam 31 and the metal droplet 21. In this plasma formation process, debris is formed, however, since the EUVL system in FIG. 3(c) includes a collector pellicle 160 formed on the frame 150, the debris 26 accumulates on the collector pellicle 160, not the collector mirror 40. The collector pellicle 160 has a shape including rectangular shape, semi-circular shape, elliptical shape, and any possible shape, according to some embodiments of the present disclosure. In this disclosure, only rectangular shaped collector pellicle 160 is demonstrated as an example. In some embodiments, the collector pellicle 160 covers a lower half region of the collector mirror 40, when viewed from a direction perpendicular to a major surface of the collector pellicle 160. Thus, the collector pellicle 160 can shield the EUV collector mirror 40 from debris 26 and the necessity for replacement of the EUV collector mirror 40 due to debris contamination is eliminated.

The collector pellicle 160 is designed to be easily removed from the EUVL system by using a removable frame 150. Once the collector pellicle 160 is contaminated to a level that may affect the quality of the pattern formed on the target substrate, the collector pellicle 160 is removed and replaced in some embodiments. In some embodiments of the present disclosure, the contamination is detected by a digital camera or a sensor installed inside the EUV chamber of the EUVL system. An alert message is provided to the user of the EUVL system to replace the collector pellicle 160, in some embodiments of the present disclosure.

Figure 3F:
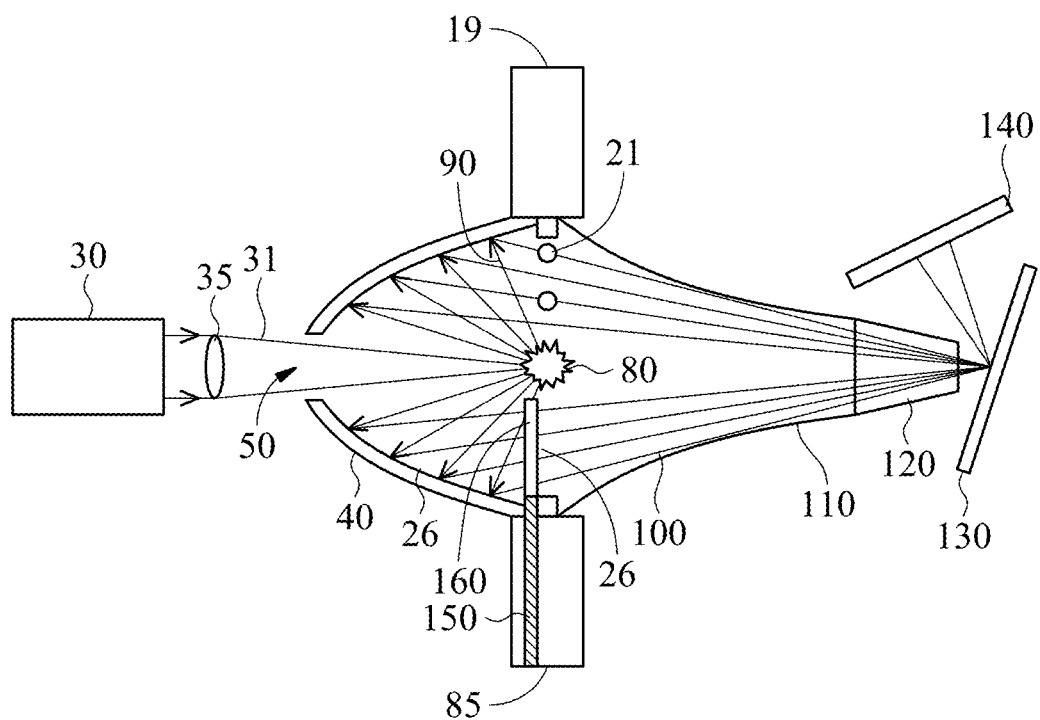
FIG. 3(f) shows a cross-sectional view of a reflective EUVL system having an EUV light source in an operation situation according to an embodiment of the present disclosure.

In reflective EUV photolithography (FIG. 3(f)), a reflective patterned mask 130 or reticle with reflective patterns is located at the second focus or intermediate focus to reflect the EUV light rays 100 off the reflective mask 130 in a patternwise manner toward the target substrate 140 or through a series of optical components (not shown) to reach the target substrate 140. The debris 26 is deposited on the collector pellicle 160, not the reflective surface of the collector mirror 40, without affecting the proper functioning of the collector mirror 40.

Figure 5A:
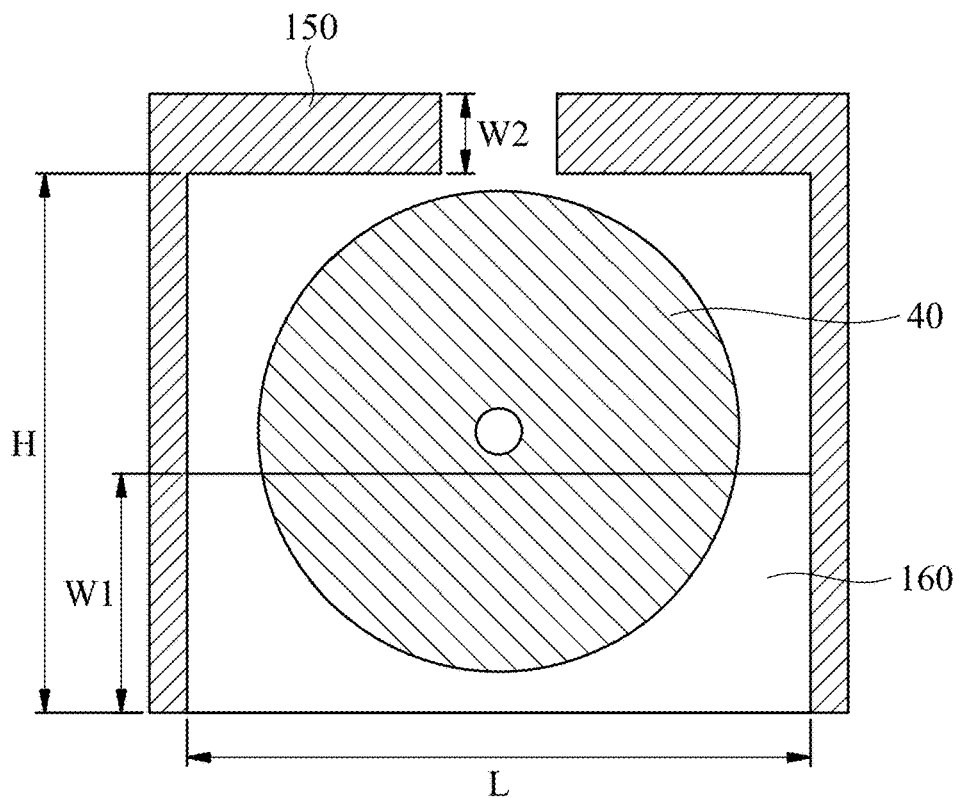
FIG. 5(a) shows an EUV collector pellicle with a collector frame in an EUVL system, according to an embodiment of the present disclosure.

FIG. 5(a) shows a front view of collector pellicle 160 on a frame 150 (FIGS. 3(c) and 3(f) show the cross-sectional view or side view of the collector pellicle 160). During operation of the EUVL system, the collector pellicle 160 is located in front of the lower portion of the reflective surface of the EUV collector mirror 40. The collector pellicle 160 and the frame 150 are formed to have a C-shape (when viewed from a direction normal to a major surface of the collector pellicle 160, i.e. a direction facing the major surface of the collector pellicle 160) with a gap of the frame 150 formed on top of the frame 150. The collector pellicle 160 is formed as a lower leg of the C-shape, in some embodiments of the present disclosure. In the embodiment shown in FIG. 5(a), the position of the collector pellicle 160 is secured by the frames 150 holding both the left and right sides of the collector pellicle 160.

In some embodiments of the present disclosure, a width W1 of the collector pellicle 160 is about 15 cm to about 40 cm, a length L of the collector pellicle 160 is about 33 cm to about 100 cm, a height H of the back of the C-shaped frame 150 in FIG. 5(a) is about 33 to 100 cm, and width W2 of the upper leg of the C-shape frame 150 is about 5 cm to about 20 cm. In some embodiments, the dimensions of W1, L, H, and W2 are set as long as a portion of the lower or upper half area of the collector 160 is covered by the collector pellicle 160.

The frame 150 is coupled to the EUV chamber housing the collector mirror 40 by means of nuts and bolts, hinge joint, sliding mechanism, or any mechanism that can fix the collector mirror 40 into a desired position inside the EUV chamber. In some embodiments, the frame 150 is attached to the drain system 85.

Figure 5B:
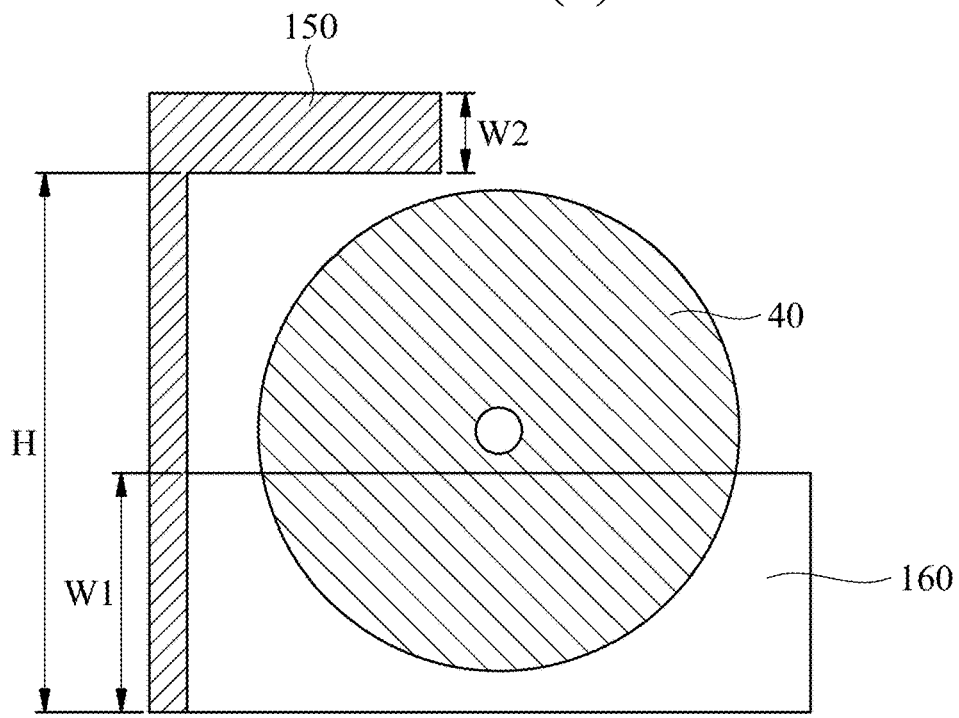
FIG. 5(b) shows an EUV collector pellicle with a collector frame in an EUVL system, according to another embodiment of the present disclosure.
Figure 5C:
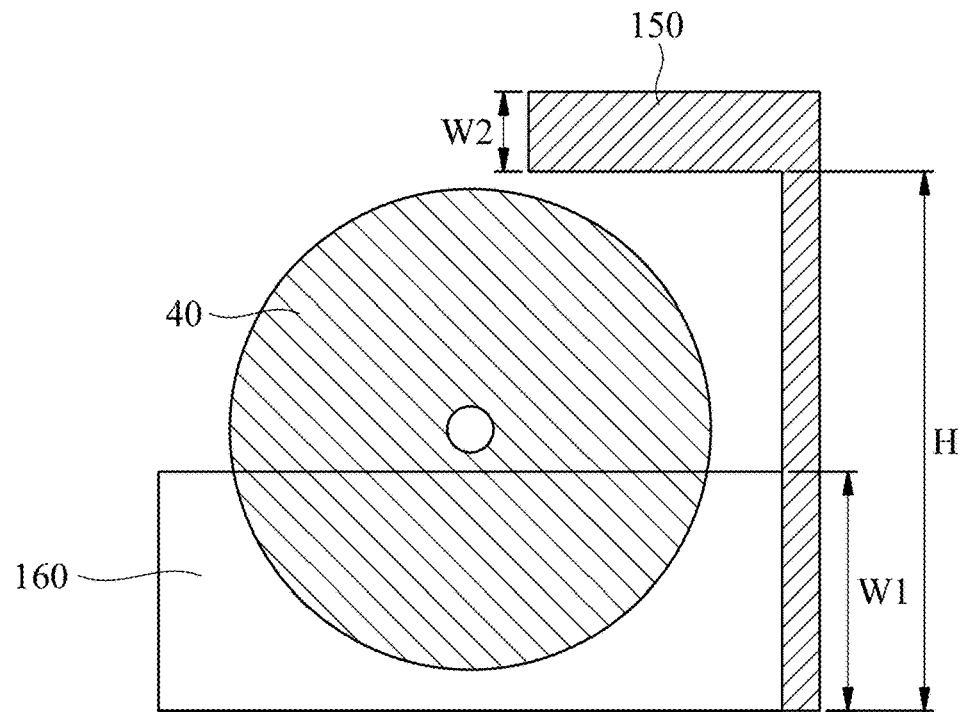
FIG. 5(c) shows an EUV collector pellicle with a collector frame in an EUVL system, according to another embodiment of the present disclosure.
Figure 5D:
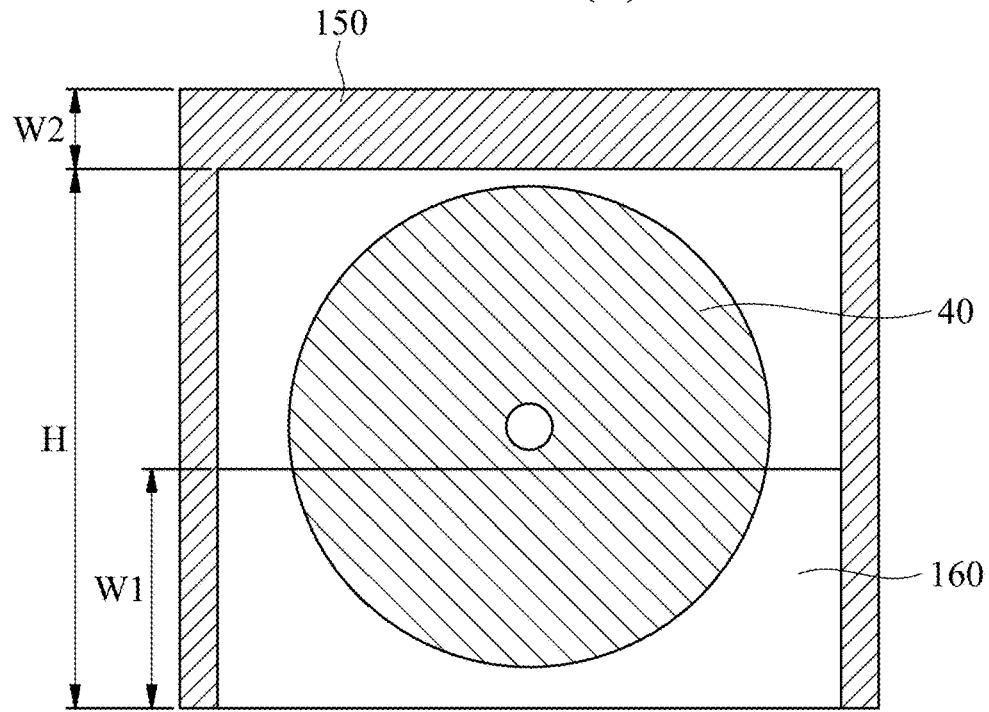
FIG. 5(d) shows an EUV collector pellicle with a collector frame in an EUVL system, according to another embodiment of the present disclosure.
Figure 5E:
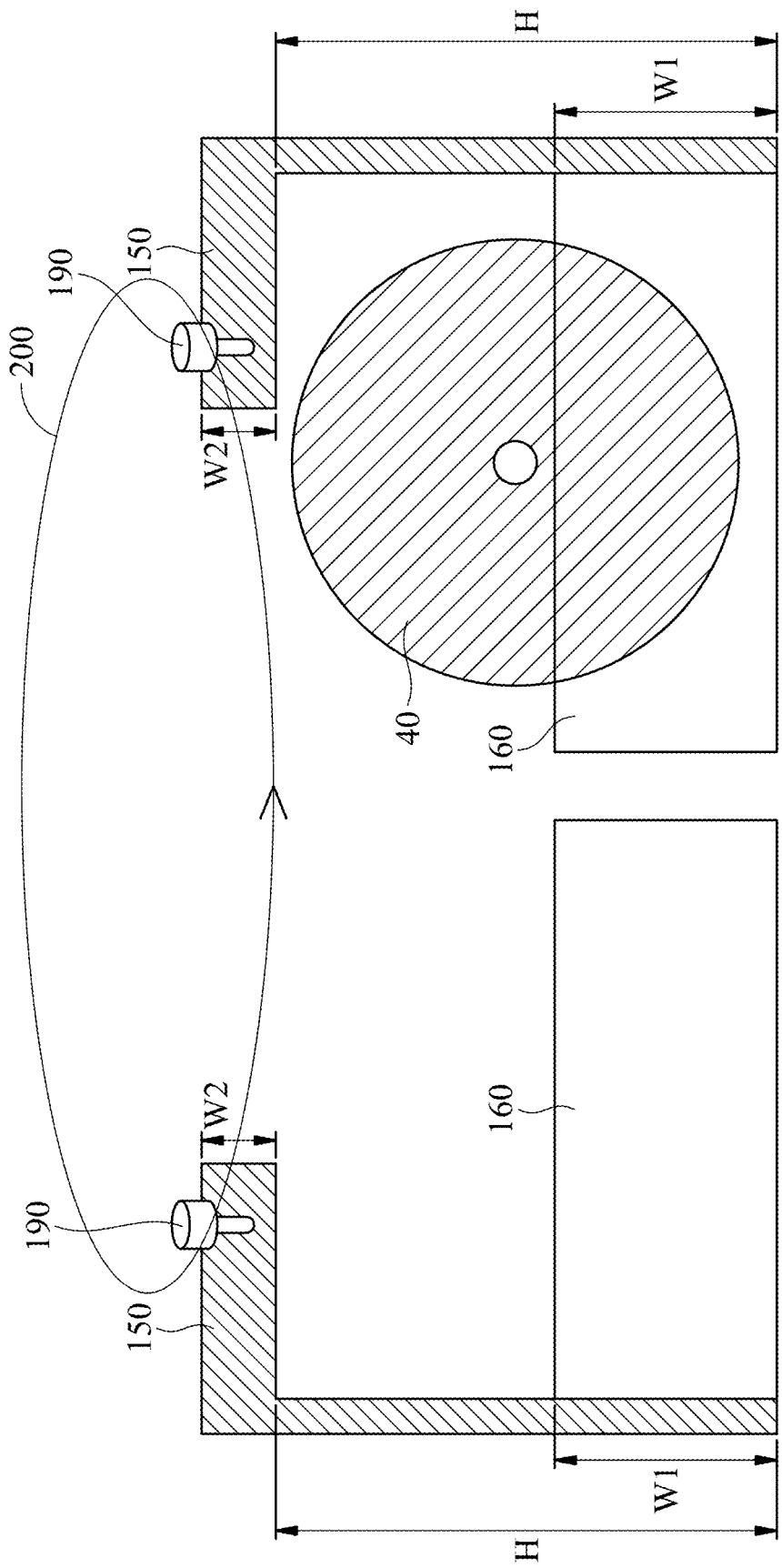
FIG. 5(e) shows an EUV collector pellicle with a collector frame in an EUVL system, according to another embodiment of the present disclosure.

FIGS. 5(b) and 5(c) show a collector pellicle 160 formed on the frame 150. During operation process of the EUVL system, the collector pellicle 160 is located in front of most of the lower portion of the reflective surface of the EUV collector mirror 40. In the embodiment shown in FIGS. 5(b) and 5(c), the position of the collector pellicle 160 is secured by the frame 150 holding only one of the left and right sides of the collector pellicle 160. Since this embodiment has one frame 150 compared with the embodiment in FIG. 5(a) having two frames 150, the time used for installing or un-installing the collector pellicle 160 is reduced.

In some embodiments of the present disclosure, a width W1 of the collector pellicle 160 is about 15 cm to about 40 cm, a length L of the collector pellicle 160 is about 33 to about 100 cm, a height H of the back of the frame 150 in FIG. 5(*b*) is about 33 to about 100 cm, and width W2 of the upper leg of the frame 150 is about 5 cm to about 20 cm. In a certain embodiment of the present disclosure, the width W1 of the collector pellicle 160 is about 15 cm, the length L of the collector pellicle 160 is about 33 cm, the height H of the back of the frame 150 is about 33 cm, and the width W2 of the upper leg of the frame 150 is about 10 cm.

FIG. 5(*d*) shows a collector pellicle 160 formed on the frame 150. During EUVL system operation, the collector pellicle 160 is located to cover the lower portion of the reflective surface of the EUV collector mirror 40 adjacent to the drain system 85 (not shown in FIG. 5(*d*)). In FIG. 5(*d*), t combination of the collector pellicle 160 and the frame 150 is formed to have an O-shape with no gap in the frame 150 like FIG. 5(*a*). In this O-shape, the collector pellicle 160 is formed as a lower leg of the O-shape, in some embodiments of the present disclosure. In the embodiment shown in FIG. 5(*a*), the position of the collector pellicle 160 is secured by the frames 150 holding both the left and right sides of the collector pellicle 160.

In some embodiments of the present disclosure, a width W1 of the collector pellicle 160 is about 15 cm to about 40 cm, a length L of the collector pellicle 160 is about 33 cm to about 100 cm, a height H of the back of the O-shaped frame 150 in FIG. 5(*d*) is about 33 cm to 100 cm, and width W2 of the upper leg of the O-shape frame 150 is about 5 cm to about 20 cm. In a certain embodiment of the present disclosure, the width W1 of the collector pellicle 160 is about 15 cm, the length L of the collector pellicle 160 is about 33 cm, the height H of the back of the O-shaped frame 150 is about 33 cm, and the width W2 of the upper leg of the frame 150 is about 10 cm.

FIG. 5(*e*) shows two collector pellicles 160' and 160" formed on two frames 150. One of the collector pellicles 160' is formed in front of the lower portion of the reflective surface of the EUV collector mirror 40 while the other one 160" does not overlap the collector mirror 40 at all. In this embodiment, the collector pellicle 160 is formed as a lower leg of the frame 150. The frames 150 are fixed to a revolving mechanism 200 using fasteners 190. In some embodiments, the frames 150 have cylindrical shape or plate shape in a front view. The revolving mechanism is controlled by a motor (not shown) which is controlled by a controller (not shown). When one of the collector pellicles 160 collects the debris to a level that may affect the quality of the EUV light rays hitting the target substrate and the quality of the pattern formed on the photosensitive coating coated target substrate 140, the contaminated collector pellicle 160 is moved or rotated along the direction indicated by the arrow in FIG. 5(*e*) by revolving so that it is completely non-overlapping the collector pellicle 160, while the uncontaminated collector pellicle 160 is moved or rotated by revolving to the position overlapping the collector mirror 40. In this way, solving the problem of debris contamination by switching the collector pellicles 160 is accomplished in a few minutes, without the need of opening the chamber of the EUVL system. In some embodiments, other than rotation mechanism, a sliding mechanism is used to insert a pellicle into the chamber. The pellicle is slided along a groove or guide into a pre-determined position for proper functioning.

In FIG. 5(*e*), one of the plurality of pellicle 160' is disposed between the collector mirror 40 and a straight line between the droplet generator 19 and the drain 85 while other one of the plurality of pellicle 160" is disposed away from the collector mirror 40.

In some embodiments of the present disclosure, a width W1 of the collector pellicle 160 is about 5 cm to about 25 cm, a length L of the collector pellicle 160 is about 20 to about 40 cm, a height H of the back of the frame 150 in FIG. 5(*e*) is about 70 to 120 cm, and width W2 of the upper leg of the frame 150 is about 5 cm to about 20 cm. In a certain embodiment of the present disclosure, the width W1 of the collector pellicle 160 is about 15 cm, the length L of the collector pellicle 160 is about 30 cm, the height H of the back of the frame 150 is about 90 cm, and the width W2 of the upper leg of the frame 150 is about 10 cm.

FIG. 6(*a*) shows a cross-sectional view of an EUVL system having an EUV light source in an operation situation according to an embodiment of the present disclosure. The EUVL system includes a laser generating system 30, a laser-focusing lens 35, an EUV collector mirror 40, a target delivery system or tin droplet ejection system 19, a drain of the unreacted tin droplet 85, a vane portion 110, a cone portion 120, a patterned mask or reticle 130, a target substrate 140, and a collector pellicle 160 installed with frame 150. The collector pellicle 160 is disposed between the collector mirror 40 and a straight line between the droplet ejection system or droplet generator 19 and the drain 85, in some embodiments. In other embodiments, the pellicle 160 is positioned outside an intermediate focus of the collector mirror 40. In some embodiments, the EUVL system further comprises a frame assembly (not shown) configured to be removably coupled to the drain 85.

During operation of the EUVL system, the target delivery system or tin droplet ejection system 19 ejects tin droplets toward the drain system 85, forming a target stream of tin droplets. A high-power and high-pulse-repetition-rate laser beam is emitted from a laser source 30, such as a gas discharge laser or a solid state laser. The emitted laser beam is focused through a focusing lens 35 forming a focused laser beam 31 which passes through an aperture 50 formed in an EUV collector mirror 40. The focused laser beam 31 is then focused at an ignition site to form plasma 80 through laser-metal interaction between the laser beam 31 and the metal droplet 21. In this plasma formation process, due to the situation in FIG. 3(*b*), debris is formed. Since the EUVL system in FIG. 6(*a*) includes a collector pellicle 160 formed on the frame 150 with W1 (FIGS. 5(*a*)-5(*e*)) up to the position just below the aperture 50, i.e. the height W1 of the 160 does not block the aperture 50 and the height is right under the bottom of the aperture 50 when the collector mirror 40 is viewed from the front of the collector mirror 40, the debris 26 formed cannot pass through the collector pellicle 160. Thus, the collector pellicle 160 can shield the EUV collector mirror 40 from debris 26 and the necessity for replacement of the EUV collector mirror 40 due to debris contamination is eliminated. The collector pellicle 160 is designed to be easily removed from the EUVL system by having the removable frame 150. Once the collector pellicle 160 collects the debris to a level that may affect the quality of the formed pattern on the target substrate through EUV photolithography as detected by a digital camera or a sensor installed inside the EUV chamber of the EUVL system, an alert message is provided to the user of the EUVL system to replace the collector pellicle 160, in some embodiments of the present disclosure. FIG. 6(*d*) shows a cross-sectional view of a reflective EUVL system having a collector pellicle according to the embodiment of FIG. 6(*a*) using reflective optics instead of transmissive optics in FIG. 6(*a*).

FIG. 6(*b*) shows a cross-sectional view of an EUVL system having an EUV light source in an operation situation according to an embodiment of the present disclosure. The EUVL system includes a laser generating system 30, a laser-focusing lens 35, an EUV collector mirror 40, a target delivery system or tin droplet ejection system 19, a drain of the unreacted tin droplet 85, a vane portion 110, a cone portion 120, a patterned mask or reticle 130, a target substrate 140, and a collector pellicle 160 installed with frame 150.

During operation of the EUVL system, the target delivery system or tin droplet ejection system 19 ejects tin droplets toward the drain system 85, forming a target stream of tin droplets. A high-power and high-pulse-repetition-rate laser beam is emitted from a laser source 30, such as a gas discharge laser or a solid state laser. The emitted laser beam is focused through a focusing lens 35 forming a focused laser beam 31 which passes through an aperture 50 formed in an EUV collector mirror 40. The focused laser beam 31 is then focused at an ignition site to form plasma 80 through laser-metal interaction between the laser beam 31 and the metal droplet 21. In this plasma formation process, due to the situation in FIG. 3(b), debris is formed. Since the EUVL system in FIG. 6(b) includes a collector pellicle 160 formed on the frame 150 with W1 (FIGS. 5(a)-5(e)) only spatially covering the bottom half portion of the collector mirror 40 when there is a wide gap between the collector pellicle 160 and the aperture 50, unlike FIG. 6(a) which has no gap between the aperture 50 and the collector pellicle 160. Thus, the collector pellicle 160 can shield the EUV collector mirror 40 from debris 26 and the necessity for replacement of the EUV collector mirror 40 due to debris contamination is eliminated. The collector pellicle 160 is designed to be easily removed from the EUVL system by having the removable frame 150. Once the collector pellicle 160 collects the debris to a level that may affect the quality of the formed pattern on the target substrate through EUV photolithography as detected by a digital camera or a sensor installed inside the EUV chamber of the EUVL system, an alert message is provided to the user of the EUVL system to replace the collector pellicle 160, in some embodiments of the present disclosure. FIG. 6(e) shows a cross-sectional view of a reflective EUVL system having a collector pellicle 40 according to the embodiment of FIG. 6(b) using reflective optics instead of transmissive optics in FIG. 6(b).

Figure 6A:
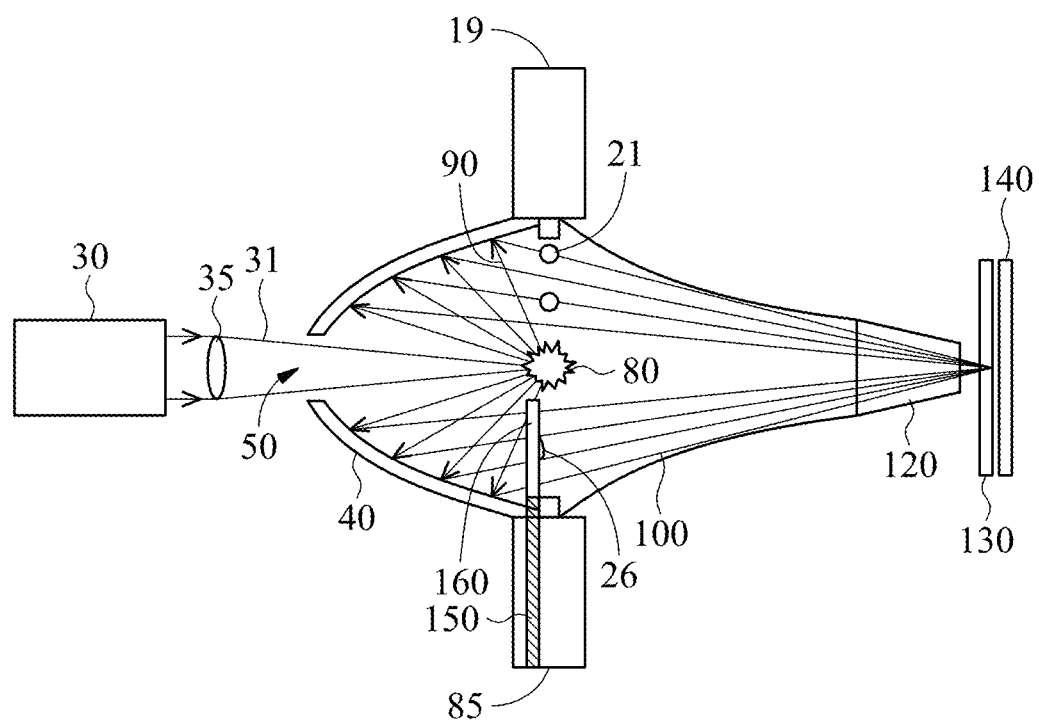
FIG. 6(a) shows a cross-sectional view of a transmissive EUVL system having a collector pellicle according to an embodiment of the present disclosure.
Figure 6B:
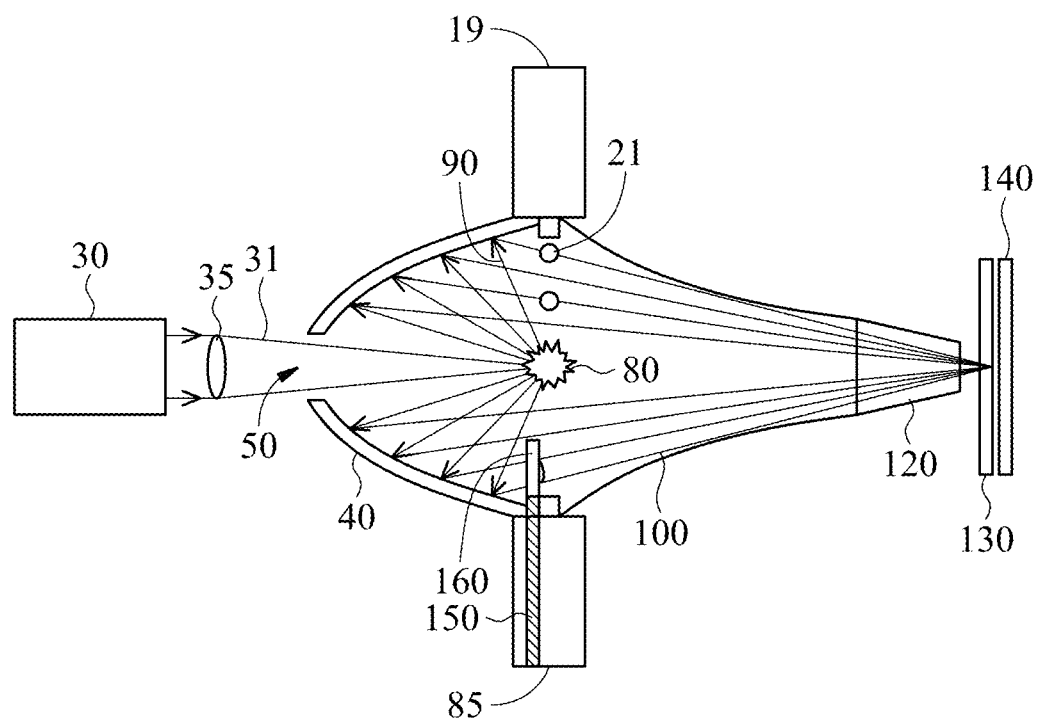
FIG. 6(b) shows a cross-sectional view of a transmissive EUVL system having a collector pellicle according to another embodiment of the present disclosure.
Figure 6C:
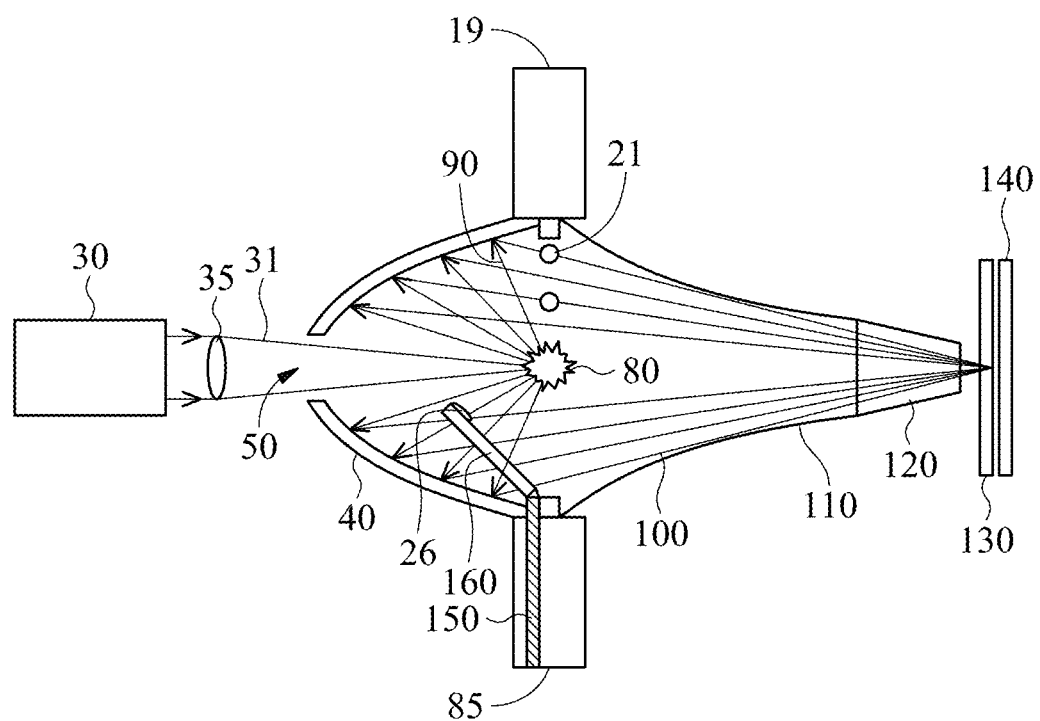
FIG. 6(c) shows a cross-sectional view of a transmissive EUVL system having a collector pellicle according to another embodiment of the present disclosure.
Figure 6D:
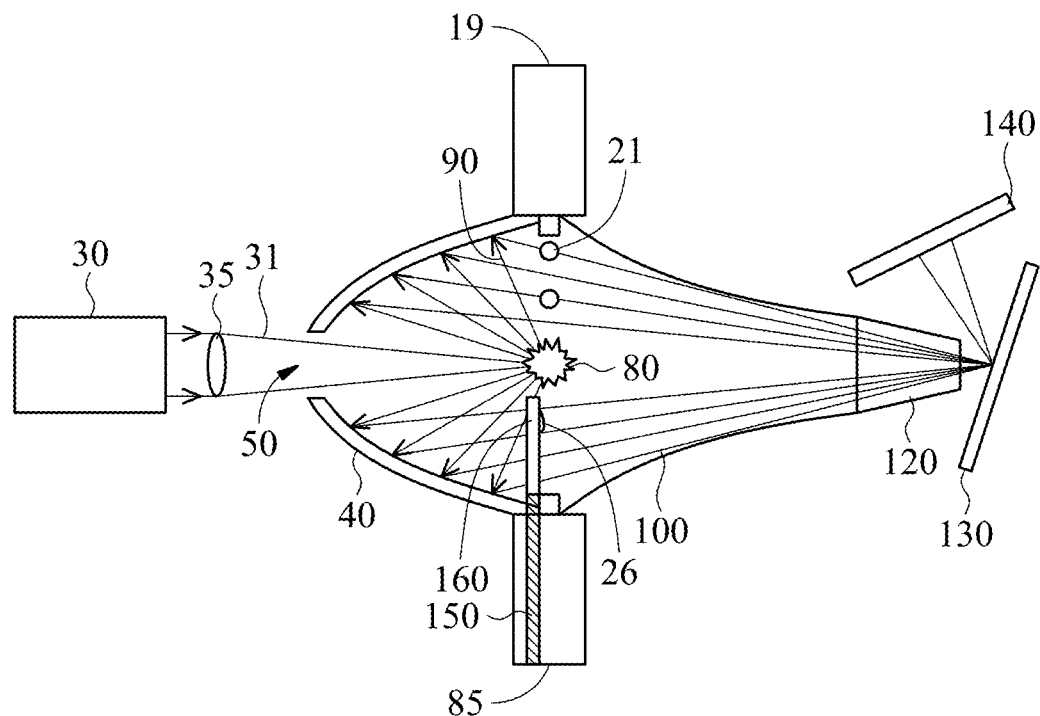
FIG. 6(d) shows a cross-sectional view of a reflective EUVL system having a collector pellicle according to the embodiment of FIG. 6(a).
Figure 6E:
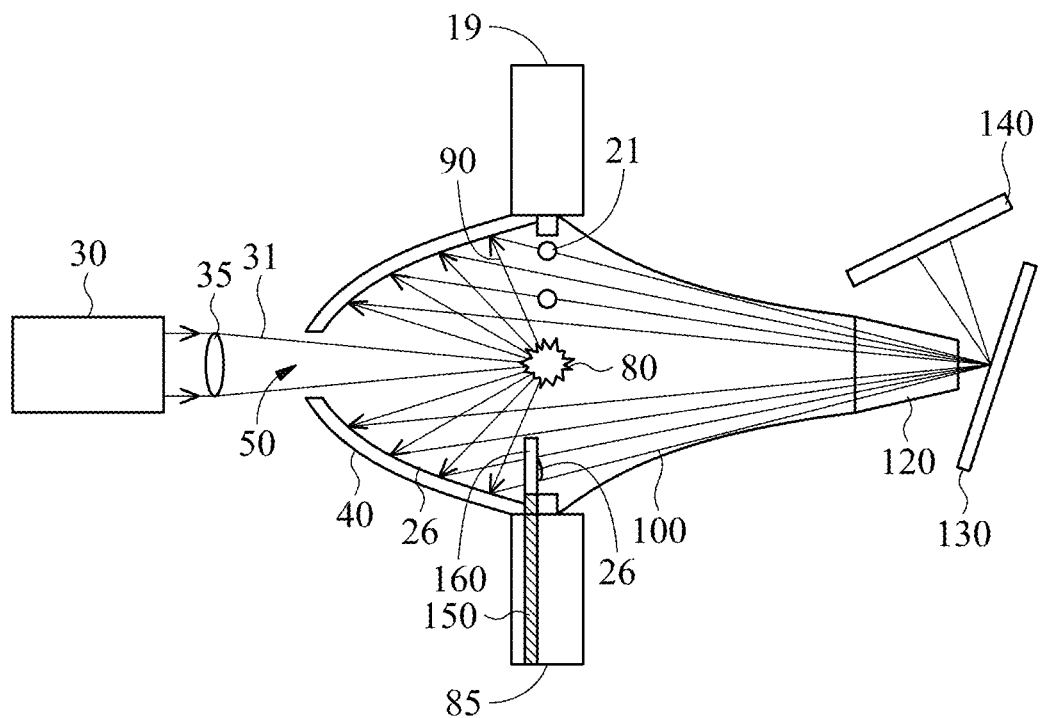
FIG. 6(e) shows a cross-sectional view of a reflective EUVL system having a collector pellicle according to the embodiment of FIG. 6(b).

FIG. 6(c) shows a cross-sectional view of an EUVL system having an EUV light source in an operation situation according to an embodiment of the present disclosure. The EUVL system includes a laser generating system 30, a laser-focusing lens 35, an EUV collector mirror 40, a target delivery system or tin droplet ejection system 19, a drain of the unreacted tin droplet 85, a vane portion 110, a cone portion 120, a patterned mask or reticle 130, a target substrate 140, and a collector pellicle 160 installed with frame 150.

Figure 6F:
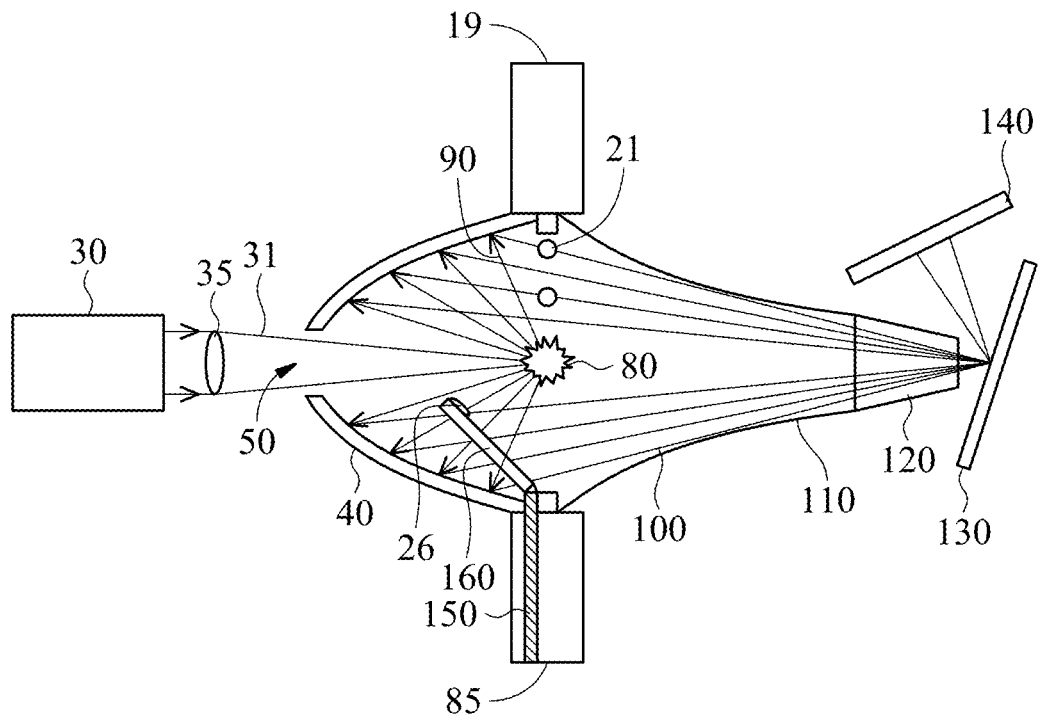
FIG. 6(f) shows a cross-sectional view of a reflective EUVL system having a collector pellicle according to the embodiment of FIG. 6(c).

During operation of the EUVL system, the target delivery system or tin droplet ejection system 19 ejects tin droplets toward the drain system 85, forming a target stream of tin droplets. A high-power and high-pulse-repetition-rate laser beam is emitted from a laser source 30, such as a gas discharge laser or a solid state laser. The emitted laser beam is focused through a focusing lens 35 forming a focused laser beam 31 which passes through an aperture 50 formed in an EUV collector mirror 40. The focused laser beam 31 is then focused at an ignition site to form plasma 80 through laser-metal interaction between the laser beam 31 and the metal droplet 21. In this plasma formation process, due to the situation in FIG. 3(b), debris is formed. Since the EUVL system in FIG. 6(c) includes a collector pellicle 160 formed on the frame 150 and is tilted toward the reflective surface of the collector mirror 40, the debris 26 formed cannot pass through the collector pellicle 160. Thus, the collector pellicle 160 can shield the EUV collector mirror 40 from debris 26 and the necessity for replacement of the EUV collector mirror 40 due to debris contamination is eliminated. The collector pellicle 160 is designed to be easily removed from the EUVL system by having the removable frame 150. Once the collector pellicle 160 collects the debris to a level that may affect the quality of the formed pattern on the target substrate through EUV photolithography as detected by a digital camera or a sensor installed inside the EUV chamber of the EUVL system, an alert message is provided to the user of the EUVL system to replace the collector pellicle 160, in some embodiments of the present disclosure. FIG. 6(f) shows a cross-sectional view of a reflective EUVL system having a collector pellicle according to the embodiment of FIG. 6(c) using reflective optics instead of transmissive optics in FIG. 6(c).

Figure 7A:
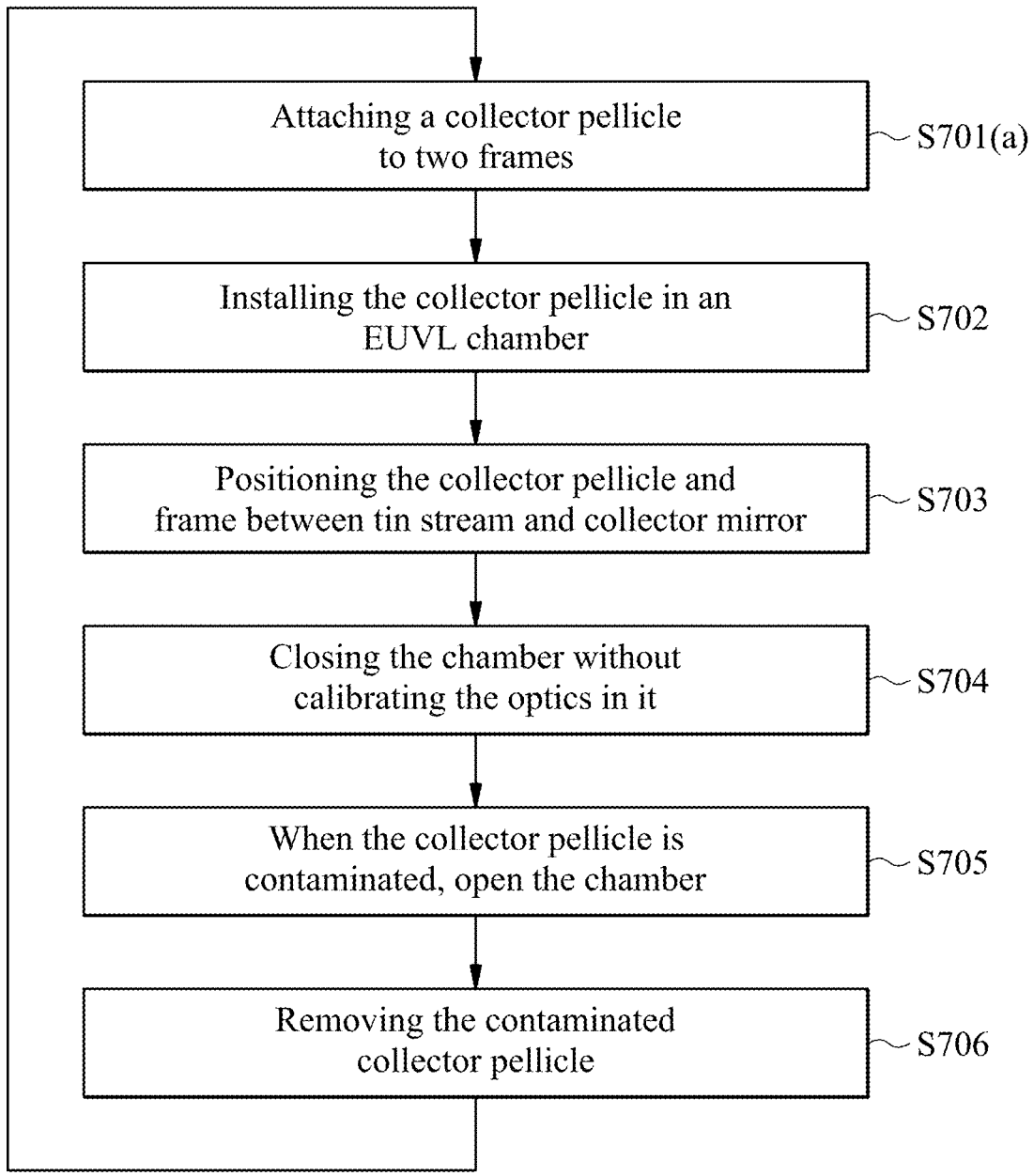
FIG. 7(a) shows a method of operating the collector pellicle, according to an embodiment of the present disclosure.

FIG. 7(a) shows a method of installing and replacing the collector pellicle, according to an embodiment of the present disclosure, for improving collector service life in an EUVL system. The method includes a step S701(a) of installing any one of the above collector pellicles (an EUV transmissive cover film/plate) onto two frames by attaching the collector pellicle with the lower ends of the frames. The method includes a step S702 of opening the chamber of the EUVL system so as to allow the installation of the collector pellicle and frames into the chamber. The method includes a step S703 of positioning the collector pellicle and frames between the path of a tin droplet stream from a droplet generator (target delivery system) to a tin drain system and a reflective surface of a collector mirror. The method further includes a step S704 of closing the chamber of the EUVL system without calibrating the optics inside the EUVL system. When the collector pellicle collects debris to a level that affects the quality of the EUV light rays impinging on the target substrate and the quality of the patterns formed on the target substrate by the EUV light rays, the method further includes a step S705 of replacing the collector pellicle by opening the chamber of the EUVL system. That is, step S705 is a step for determining when the collector pellicle needs to be replaced. A step S706 is also carried out to remove the collector pellicle. Then, the method repeats the step S701(a) to install a new collector pellicle to continue the EUV photolithography process.

Figure 7B:
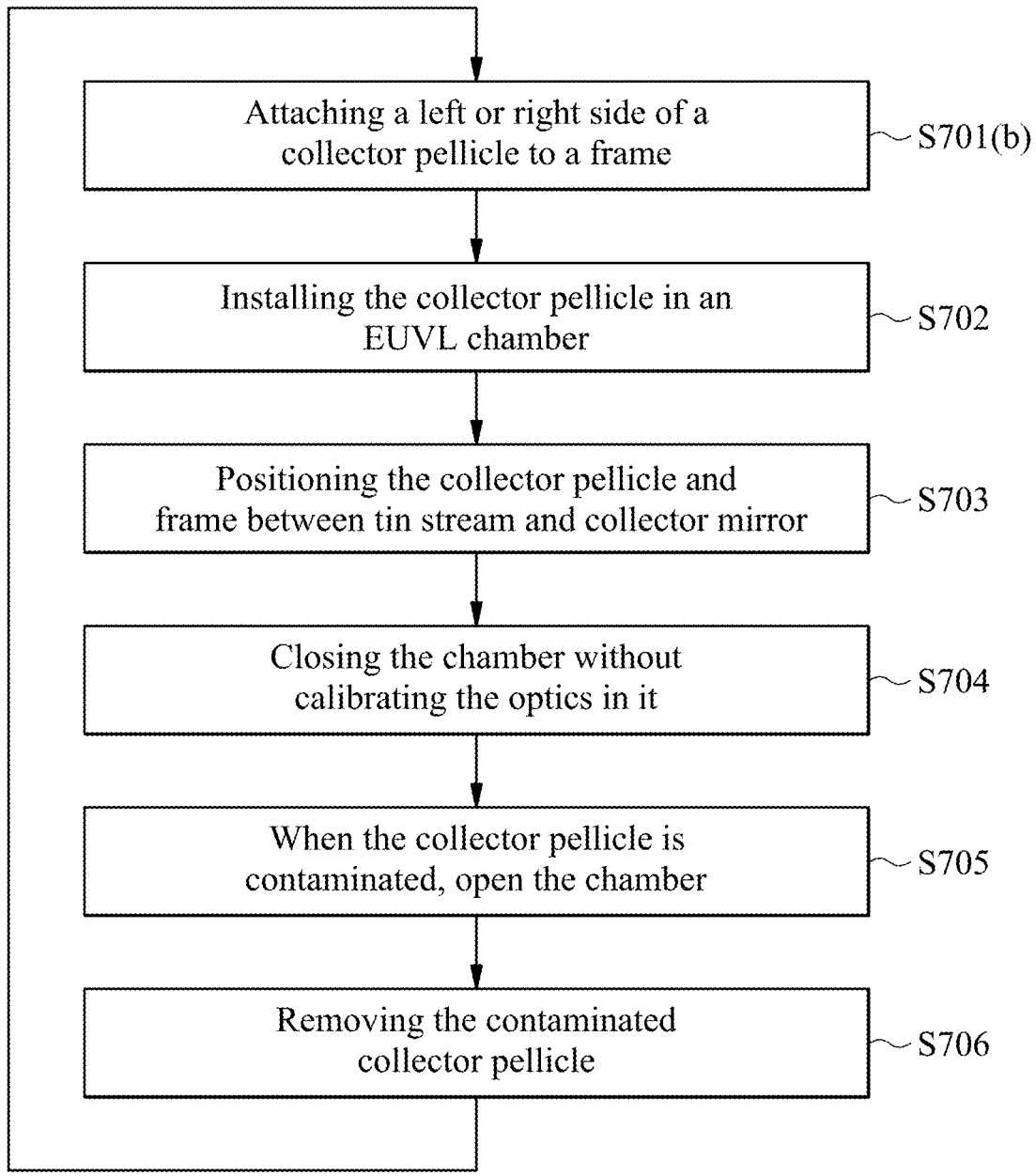
FIG. 7(b) shows a method of operating the collector pellicle, according to another embodiment of the present disclosure.

FIG. 7(b) shows a method of installing and replacing a collector pellicle, according to an embodiment of the present disclosure, for improving collector service life in an EUVL system. The method includes a step S701(b) of installing the collector pellicle (EUV transmissive cover film/plate) onto a frame by attaching a left or right side of the collector pellicle with the lower end of the frame. The method includes a step S702 of opening the chamber of the EUVL system so as to allow the installation of the collector pellicle-installed frame into the chamber. The method includes a step S703 of positioning the collector pellicle (an EUV transmissive cover film/plate) between the path of tin droplet stream from a droplet generator (target delivery system) to a tin drain system and a reflective surface of a collector mirror. The method further includes a step S704 of closing the chamber of the EUVL system without tuning the optics inside the EUVL system. After prolonged use and when the collector pellicle is contaminated by debris to a level that affects the quality of the EUV light rays impinging on the target substrate and the quality of the patterns formed on the target substrate by the EUV light rays, the method further includes a step S705 of replacing the collector pellicle by opening the chamber of the EUVL system, and a step S706 of removing the collector pellicle. Then, the method repeats the step S701(b) to install a new collector pellicle to continue the EUV photolithography process.

Figure 7C:
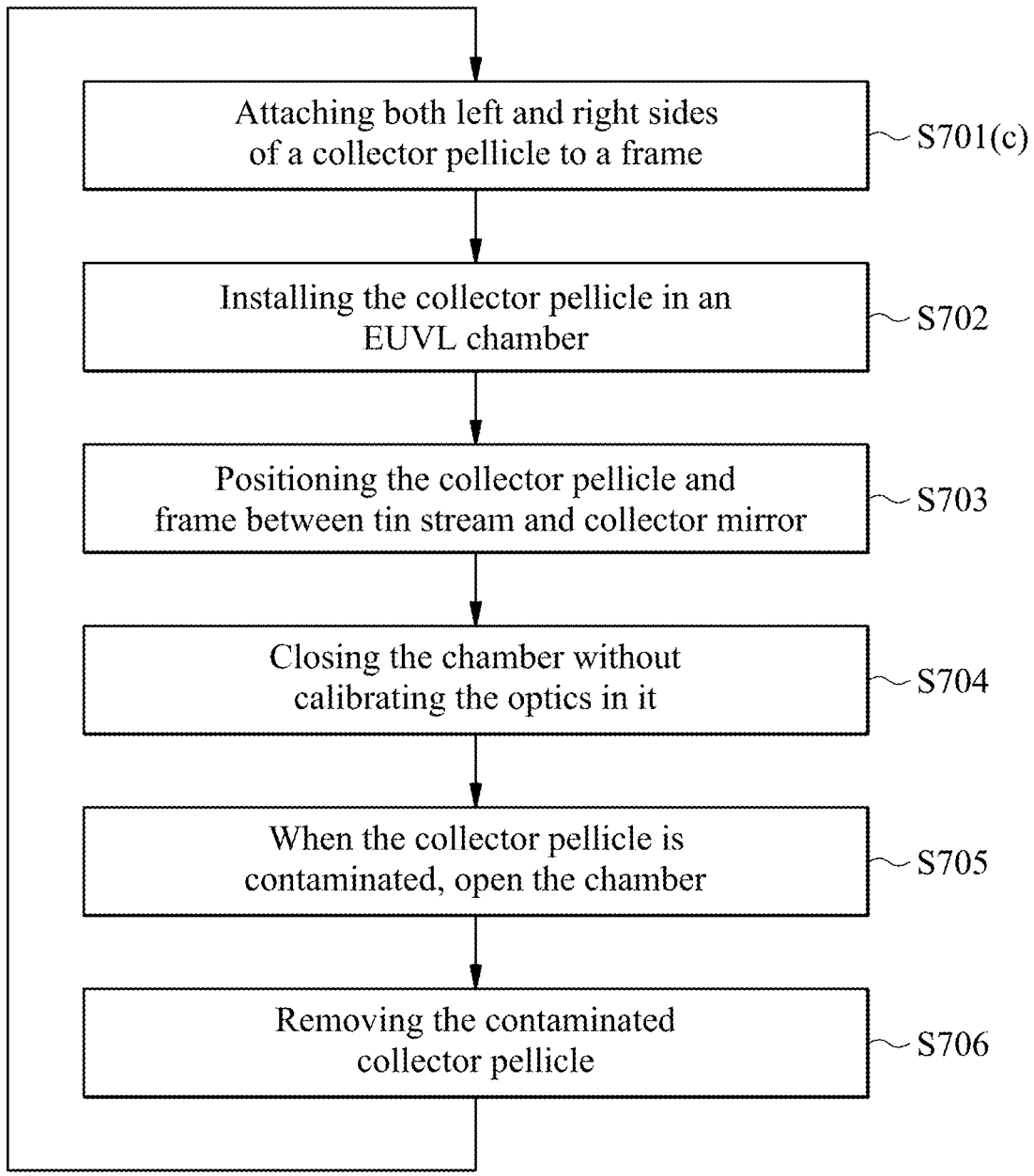
FIG. 7(c) shows a method of operating the collector pellicle, according to another embodiment of the present disclosure.

FIG. 7(c) shows a method of operating the collector pellicle, according to an embodiment of the present disclosure, for improving collector service life in an EUVL system. The method includes a step S701(c) of installing the collector pellicle (EUV transmissive cover film/plate) onto a frame by attaching both left and right sides of the collector pellicle with the lower ends of the frame. The method includes a step S702 of opening the chamber of the EUVL system so as to allow the installation of the collector pellicle-installed frame into the chamber. The method includes a step S703 of positioning the collector pellicle (an EUV transmissive cover film/plate) between the path of tin droplet stream from a droplet generator (target delivery system) to a tin drain system and a reflective surface of a collector mirror. The method further includes a step S704 of closing the chamber of the EUVL system without calibrating the optics inside the EUVL system. After prolonged use and when the collector pellicle is contaminated by debris to a level that affects the quality of the EUV light rays hitting the target substrate and the quality of the patterns formed on the target substrate by the EUV light rays, the method further includes a step S705 of replacing the collector pellicle by opening the chamber of the EUVL system, and a step S706 of removing the collector pellicle. Then, the method repeats the step S701(c) to install a new collector pellicle to continue the EUV photolithography process.

FIG. 7(d) shows a method of installing and replacing the collector pellicle, according to an embodiment of the present disclosure, for improving collector service life in an EUVL system. The method includes a step S701(d1) of installing the collector pellicle (EUV transmissive cover film/plate) onto a frame by attaching the collector pellicle with the lower end of the frame. The method further includes an optional step S701(d2) of installing another collector pellicle onto another frame by attaching the collector pellicle with the lower end of the another frame.

The method further includes a step S702 of opening the chamber of the EUVL system so as to allow the installation of the collector pellicles into the chamber. The method further includes a step S703(d1) of positioning the collector pellicle(s) between the path of a tin droplet stream from a droplet generator (target delivery system) to a tin drain system and a reflective surface of a collector mirror, and installing the frame onto a revolving mechanism. The method further includes an optional step S703(d2) of positioning the above collector pellicle, installed in step S703(d2), to a position non-overlapping the collector mirror and installing the frame onto a revolving mechanism.

The method further includes a step S704 of closing the chamber of the EUVL system without tuning the optics inside the EUVL system. When the collector pellicle installed in step S703(d1) is contaminated by debris to a level that affects the quality of the EUV light rays hitting the target substrate and the quality of the patterns formed on the target substrate by the EUV light rays, the method further includes a step S705' of rotating (or by sliding in other embodiments of the present disclosure), by the revolving mechanism in FIG. 5(e), the frames installed in the steps S703(d1) and S703(d2) to remove the contaminated collector mirror away from a position overlapping the collector mirror to a position non-overlapping the collector mirror, and rotating, by the revolving mechanism, the non-overlapping collector pellicle installed in step S703(d2) to a position overlapping the collector mirror without opening the chamber of the EUVL system. When the rotated collector pellicle installed in step S703(d2) is also contaminated, the method further includes a step S706 of removing both of the collector pellicle by opening the chamber of the EUVL system. Then, the method repeats the step S701(d1) and the optional step S701(d2) to install new collector pellicles to continue the EUV photolithography process.

The collector pellicle/frame combinations according to the present disclosure improve collector service life by preventing tin drippings and debris from accumulating on the collector surface. Further, a fouled pellicle can be removed and replaced in a significantly shorter period of time than replacing a collector. The optical system does not have to be realigned and re-calibrated when the pellicle is replaced, as the optical parts are not replaced. On the other hand, when the collector is replaced, realignment and re-calibration of the optical system is necessary. Therefore, replacing the collector can result in several days in lost EUVL system downtime, while collector pellicles can be replaced in less than a day in some embodiments. Replacing the pellicle instead of the collector provides up to a 7% increase in EUVL system availability for production.

It will be understood that not all advantages have been necessarily discussed herein, no particular advantage is required for all embodiments or examples, and other embodiments or examples may offer different advantages.

An embodiment according to the present disclosure includes a method of improving collector service life in an extreme ultraviolet lithographic system by positioning a first pellicle between a path of tin droplets from a droplet generator to a tin drain and a collector reflecting surface, and replacing the first pellicle with a second pellicle when the first pellicle's transmittance to extreme ultraviolet light is within an unacceptable range. In some embodiments of the present disclosure, the method further includes the first pellicle is attached to a first frame, the first pellicle and the first frame together form a C shape, with the first pellicle forming a lower leg of the C shape. The second pellicle is attached to a second frame, the second pellicle and the second frame together forms a C shape, with the second pellicle forming a lower leg of the C shape. In some embodiments of the present disclosure, the first pellicle is removed from a first side of a collector housing enclosing the collector having the collector reflecting surface, and the second pellicle is introduced into the collector housing from a second side of the collector housing opposing the first side of the collector housing. In some embodiments of the present disclosure, the method further includes the first pellicle is removed by rotating the first pellicle. In other embodiments of the present disclosure, the method further includes the first pellicle is removed by sliding the first pellicle. In some embodiments of the present disclosure, the method includes opening and closing the collector housing. In some embodiments of the present disclosure, opening and closing the collector housing are not required. In some embodiments of the present disclosure, the first and second pellicles are configured so that the pellicles cover a portion of the collector where a significant portion of tin drippings accumulate.

Another embodiment according to the present disclosure is a combination of a pellicle and a frame configured to block tin drippings from accumulating on a collector in an extreme ultraviolet lithographic system. The combination includes a pellicle attached to a frame at a lower portion of the frame. The combination of the pellicle and the frame form a C-shape, and the pellicle forms a lower leg of the C-shape. In some embodiments of the present disclosure, the pellicle is semi-transparent to visible light, and is transparent to extreme ultraviolet light. In some embodiments of the present disclosure, the pellicle is made of one of silicon nitride, silicon carbide, polysilicon, and graphene. In some embodiments of the present disclosure, the pellicle is positioned between plasma formed in the extreme ultraviolet lithographic system and a reflective surface of the collector.

Another embodiment according to the present disclosure is an extreme ultraviolet light source. The extreme ultraviolet light source includes a tin droplet generator and a tin drain on opposing sides of a tin droplet path. The extreme ultraviolet light source further includes a collector mirror, and a pellicle disposed between the tin droplet path and the collector mirror. In some embodiments of the present disclosure, the pellicle is replaceable. In some embodiments of the present disclosure, the pellicle is attached to a frame. In some embodiments of the present disclosure, the frame is attached to a revolving mechanism to rotate the frame away from a position overlapping the collector mirror. In some embodiments of the present disclosure, the frame is attached to a sliding mechanism to slide the frame away from a position overlapping the collector mirror. In some embodiments of the present disclosure, a second pellicle is installed, with the pellicle, inside the extreme ultraviolet lithographic system at a position non-overlapping the collector mirror. In some embodiments of the present disclosure, the second pellicle is formed on a second frame attached to a revolving mechanism. In some embodiments of the present disclosure, the second pellicle is formed on a second frame attached to a sliding mechanism.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) source, comprising
   a collector mirror;
   a drain;
   a droplet generator configured to eject a target material toward the drain;
   a pellicle disposed over only a lower half region of the collector mirror, when viewed from a direction perpendicular to a major surface of the pellicle, wherein the pellicle is configured to catch debris formed of the target material; and
   a frame assembly configured to be removably coupled to the drain, wherein the frame assembly is operated by a hinge mechanism; and
   wherein the pellicle is disposed on the frame assembly.

2. The EUV source of claim 1, wherein the pellicle is disposed between the collector mirror and a straight line between the droplet generator and the drain.

3. The EUV source of claim 1, wherein the pellicle is positioned outside an intermediate focus of the collector mirror.

4. The EUV source of claim 1, wherein the pellicle is made of an EUV light-transmitting material including silicon carbide, polysilicon, graphene, and silicon nitride.

5. The EUV source of claim 1, wherein the collector mirror is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc.

6. The EUV source of claim 5, further comprising a capping layer formed on the collector mirror.

7. The EUV source of claim 6, wherein the capping layer includes SiO$_2$, Ru, TiO$_2$, and ZrO$_2$.

8. An extreme ultraviolet (EUV) source, comprising
   a collector mirror;
   a drain;
   a droplet generator configured to eject a target material toward the drain;
   a plurality of pellicles, wherein one of the plurality of pellicles is configured to catch debris formed of the target material, and wherein the one of the plurality of pellicles is disposed over only a lower half region of the collector mirror, when viewed from a direction perpendicular to a major surface of the plurality of pellicles; and
   a frame assembly configured to be removably coupled to the drain, wherein the frame assembly is operated by a hinge mechanism; and
   wherein the pellicle is disposed on the frame assembly.

9. The EUV source of claim 8, wherein the one of the plurality of pellicle is disposed between the collector mirror and a straight line between the droplet generator and the drain.

10. The EUV source of claim 9, wherein other one of the plurality of pellicle is disposed away from the collector mirror.

11. The EUV source of claim 8, wherein the pellicle is positioned outside an intermediate focus of the collector mirror.

12. The EUV source of claim 8, wherein the pellicle is made of an EUV light-transmitting material including silicon carbide, polysilicon, graphene, and silicon nitride.

13. The EUV source of claim 8, wherein the collector mirror is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc.

14. The EUV source of claim 13, further comprising a capping layer formed on the collector mirror.

15. The EUV source of claim 14, wherein the capping layer includes SiO$_2$, Ru, TiO$_2$, and ZrO$_2$.

16. A method of improving collector service life in an extreme ultraviolet lithographic system, comprising:
    positioning a first pellicle between a straight line path of tin droplets from a droplet generator to a tin drain and a collector reflecting surface, wherein the first pellicle is disposed over only a lower half region of the collector reflecting surface, when viewed from a direction perpendicular to a major surface of the first pellicle;
    providing a frame assembly configured to be removably coupled to the drain, wherein the frame assembly is operated by a hinge mechanism;
    wherein the pellicle is disposed on the frame assembly; and
    replacing the first pellicle with a second pellicle when the first pellicle's transmittance to extreme ultraviolet light is within an unacceptable range.

17. The method of claim 16, wherein the pellicle is made of an EUV light-transmitting material including silicon carbide, polysilicon, graphene, and silicon nitride.

18. The method of claim 16, wherein the first pellicle is positioned outside an intermediate focus of the collector before the replacing the first pellicle with the second pellicle.

19. The method of claim 16, wherein the second pellicle is positioned outside an intermediate focus of the collector after the replacing the first pellicle with the second pellicle.

20. The method of claim 16, wherein the collector is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc.

* * * * *